(12) United States Patent
Kurihara

(10) Patent No.: US 7,932,470 B2
(45) Date of Patent: Apr. 26, 2011

(54) PRINTED WIRING BOARD

(75) Inventor: Hiroaki Kurihara, Tokyo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 872 days.

(21) Appl. No.: 11/850,325

(22) Filed: Sep. 5, 2007

(65) Prior Publication Data
US 2008/0053691 A1 Mar. 6, 2008

(30) Foreign Application Priority Data

Sep. 5, 2006 (JP) .................................. 2006-240571

(51) Int. Cl.
H05K 1/00 (2006.01)

(52) U.S. Cl. ........................................ 174/254; 174/260

(58) Field of Classification Search .................. 174/254, 174/260, 262; 361/749, 760, 803; 439/65, 439/74; 349/149, 150
See application file for complete search history.

(56) References Cited

U.S. PATENT DOCUMENTS

| | | | |
|---|---|---|---|
| 6,104,465 A | 8/2000 | Na et al. | |
| 6,744,638 B2 | 6/2004 | Terasaka | |
| 6,879,367 B2 * | 4/2005 | Ukita | 349/149 |
| 7,123,332 B2 * | 10/2006 | Yamazaki et al. | 349/149 |
| 2006/0163718 A1 * | 7/2006 | Kurihara | 257/702 |
| 2006/0220991 A1 * | 10/2006 | Lee et al. | 345/52 |

FOREIGN PATENT DOCUMENTS

| | | | |
|---|---|---|---|
| JP | 2525996 B2 | | 5/1996 |
| JP | 08172250 | * | 7/1996 |
| JP | 2769130 B2 | | 4/1998 |
| JP | 2000187451 A | | 7/2000 |
| JP | 2002314212 A | | 10/2002 |
| JP | 2005274673 A | | 10/2005 |

* cited by examiner

Primary Examiner — Ishwarbhai B Patel
Assistant Examiner — Yuriy Semenenko
(74) Attorney, Agent, or Firm — The Webb Law Firm

(57) ABSTRACT

A printed wiring board group includes a plurality of printed wiring boards wherein a difference ($\Delta\Omega$-AB) between an average electric resistance (A-ave.) of wires formed in one printed wiring board (A) and an average electric resistance (B-ave.) of wires formed in a printed wiring board (B) adjacent to the printed wiring board (A) is within a range of ±5% of an average electric resistance (AB-ave.) of the wires of the printed wiring boards (A) and (B); and a difference ($\Delta\Omega$-ab) between an electric resistance (a-3) of an outermost wire of the printed wiring board (A) and an electric resistance (b-3) of an outermost wire of the printed wiring board (B) is within a range of ±11.05%, preferably within a range of ±6.12%, and is particularly preferably within a range of ±6.00% of the average electric resistance (AB-ave.) of the printed wiring boards (A) and (B).

20 Claims, 8 Drawing Sheets

PRINTED WIRING BOARD

BACKGROUND OF THE INVENTION

1. Field of the Invention

The present invention relates to a printed wiring board group in which a plurality of printed wiring boards are arranged. More particularly, the present invention relates to a printed wiring board group composed of a plurality of printed wiring boards in which the electric resistance is uniform regardless of the configuration of the wiring pattern.

2. Description of the Related Art

Printed wiring boards used for electronic packaging are generally manufactured as follows. First, a photosensitive resin layer is formed on a surface of a conductive metal layer formed on an insulating film such as a polyimide film. Next, this photosensitive resin layer is exposed and developed in a desired form to form patterns. The printed wiring boards are manufactured by selectively etching the conductive metal layer by use of the patterns as a masking material, and thereby forming wires similar in shape to the masking material on the surface of the insulating film.

When such printed wiring boards are manufactured, a conductive metal layer is formed on an insulating film in a tape shape of several tens to several hundreds of meters, and a large number of printed wiring boards are sequentially manufactured. A large number of such printed wiring boards are considered as having identical characteristics.

Further, a large number of wires formed in one printed wiring board are regarded as having identical characteristics. A variation in electric resistance among wires is extremely small. For example, electric current flowing in a printed wiring connected to a liquid crystal panel is in the order of $\mu A$, and no attention has been paid to that there is a variation in electric resistance among the wires of the wiring.

However, in practice, for example, in a case in which the wires on the insulating film are different in length from one another, the electric resistances of the wires are different. When the thickness of a wiring pattern is uniform, an electric resistance of a wire of a printed wiring board is greater in proportion to a length of the wire, and is smaller in inverse proportion to a width of the wire.

Therefore, for example, in a printed wiring board in which an electronic part such as an IC chip is mounted near the center of the wiring board, the wires are shorter and have a smaller electric resistance as they are close to the center line, while the outer wires are long and have a larger electric resistance.

With focus on these respects, in Japanese Patent No. 2769130 (Patent Document 1), Japanese Patent No. 2525996 (Patent Document 2) and the like, there are disclosed inventions of a flexible printed circuit board in which the electric resistances of conductive paths are made substantially uniform by changing the width of wires. Namely, in Patent Documents 1 and 2, there are disclosed flexible printed circuit boards in which the width of the wires is adjusted such that the electric resistance of wires formed on the inner side and the electric resistance of wires formed on the outer side are made substantially uniform by making the width of the wires positioned on the outer side of the flexible printed circuit board larger than that of the wires positioned on the inner side.

In this way, when the wires in one flexible printed circuit board are changed in width depending on the length of the wires, it is possible to make the electric resistances of the wires substantially the same. Note that, in Patent Document 1 and Patent Document 2, that the electric resistances are substantially the same is defined as "the electric resistances of conductive paths are different from the intermediate value of the maximum resistance and the minimum resistance at most by 10 to 20% of the intermediate value" (refer to, for example, the paragraph [0017] in Patent Document 1).

In this way, when the electric resistances of the wires in one flexible printed circuit board are substantially uniform, input electric signals are uniformly varied by the electric resistances of the conductive paths, and the intensity of an output electric signal and the intensity of an input electric signal are less susceptible to the electric resistances of the conductive paths, which makes it possible to stably drive the flexible printed circuit board.

Meanwhile, printed wiring boards for electronic packaging (flexible printed circuit boards) have been used in various fields of computers, display apparatuses, various control devices and the like. Further, a great variety of electronic apparatuses have been controlled by semiconductor devices in which electronic parts have been mounted. Conventionally, such an electronic apparatus has been controlled by one electronic part. However, in accordance with the increasingly complicated and diversified control systems, there is a tendency to control one apparatus by using a plurality of electronic parts. In particular, in a display apparatus, a display panel is controlled by a large number of printed wiring boards disposed in parallel. An attempt has been made to increase an operation speed by a plurality of identical LSIs disposed in parallel. If a value of current flowing in such a circuit subtly changes, a malfunction may be caused.

Further, in the field of display apparatuses and the like, display elements in which pixels are made to emit light by emission of electrons have been developed. In such a display apparatus, it is necessary to increase a density of flowing electric current and a voltage applied because the efficiency of emission of electrons is low.

In such high-precision next-generation electronics, unlike conventional printed wiring boards on which electronic parts are merely mounted, a situation may occur in which the properties of the electronics are changed by the electric resistance of wires formed in printed wiring boards. For example, in a display apparatus, when there is a difference in supply current due to different electric resistances of wires, the brightness of pixels with low electric current tends to be low. Accordingly, a variation in the electric resistances of wires formed in a printed wiring board is desirably as small as possible.

Moreover, as described above, a printed wiring board is manufactured by forming a large number of wirings composed of a conductive metal on the surface of an insulating film of several tens to several hundreds of meters. Therefore, it is difficult to manufacture printed wiring boards having exactly the same properties even by the same method due to various factors such as etchant used for forming the wiring boards, and the metal forming the conductive metal layer (for example, the state of a copper layer). Moreover, even in the same lot, the properties of a printed wiring board manufactured at the beginning and a printed wiring board manufactured at the end are not exactly the same.

Accordingly, when the properties of adjacent printed wiring boards are different from one another, the problem will be brought about that, for example, shading and the like are easily generated on a display screen of a dominating printed wiring board. In particular, when a difference in the electric resistances between the outermost wire of a printed wiring board and the outermost wire of an adjacent printed wiring board is large, a brightness difference such as a clear separation line appears on the display apparatus. Further, in a case in which a plurality of identical electronic parts are disposed in parallel, the entire electronic apparatus can malfunction due to a slight difference in output current among the electronic parts.

In conventional printed wiring boards, the problem has been overcome to some extent by merely making the electric resistances of wires in one printed wiring board uniform. However, under the present situation where electronics are highly evolving, it is necessary not only to control the electric resistances of the wires in each printed wiring board, but also to maintain the relationship of the electric resistances of adjacent printed wiring boards in an appropriate range.

[Patent Document 1] Japanese Patent No. 2769130
[Patent Document 2] Japanese Patent No. 2525996

SUMMARY OF THE INVENTION

An object of the present invention is to provide a printed wiring board group in which a plurality of printed wiring boards are disposed, wherein a variation of electric current flowing in wires formed in each printed wiring board is small, and further wherein when the plurality of the printed wiring boards are disposed in parallel, a current variation due to a variation in the properties among the printed wiring boards is small.

An aspect of the present invention provides a printed wiring board group that comprises a plurality of printed wiring boards having a wiring pattern of a large number of wires composed of a conductive metal on a surface of an insulating film, wherein a difference ($\Delta\Omega$–AB) between an average electric resistance (A-ave.) of wires formed in one printed wiring board (A) and an average electric resistance (B-ave.) of wires formed in a printed wiring board (B) adjacent to the printed wiring board (A) is within a range of ±5% of an average electric resistance (AB-ave.) of the wires of the printed wiring board (A) and the printed wiring board (B), and a difference ($\Delta\Omega$–ab) between an electric resistance (a-3) between an outer lead and an inner lead of an outermost wire closest to the printed wiring board (B), of the printed wiring board (A), and an electric resistance (b-3) between an outer lead and an inner lead of an outermost wire closest to the printed wiring board (A), of the printed wiring board (B) is within a range of ±11.05%, preferably within a range of ±6.12%, and is particularly preferably within a range of ±6.00% of the average electric resistance (AB-ave.) of the wires of the printed wiring board (A) and the printed wiring board (B).

Further, an aspect of the present invention provides a printed wiring board group that comprises a plurality of printed wiring boards having a wiring pattern of a large number of wires composed of a conductive metal on a surface of an insulating film, wherein a difference ($\Delta\Omega$–AB) between an average electric resistance (A-ave.) of wires formed in one printed wiring board (A) and an average electric resistance (B-ave.) of wires formed in a printed wiring board (B) adjacent to the printed wiring board (A) is within a range of ±5% of an average electric resistance (AB-ave.) of the wires of the printed wiring board (A) and the printed wiring board (B), a difference ($\Delta\Omega$–ab) between an electric resistance (a-3) between an outer lead and an inner lead of an outermost wire closest to the printed wiring board (B), of the printed wiring board (A), and an electric resistance (b-3) between an outer lead and an inner lead of an outermost wire closest to the printed wiring board (A), of the printed wiring board (B) is within a range of ±6% of the average electric resistance (AB-ave.) of the wires of the printed wiring board (A) and the printed wiring board (B), a difference ($\Delta\Omega$–a) between an electric resistance (a-1) between an outer lead and an inner lead of an arbitrary wire (A-1) among a large number of the wires of the printed wiring board (A), and an electric resistance (a-2) between an outer lead and an inner lead of a wire (A-2) adjacent to the wire (A-1) is within a range of ±6% of the average electric resistance (A-ave.) of the wires of the printed wiring board (A), and a difference ($\Delta\Omega$–A) between a maximum electric resistance (a-max) and a minimum electric resistance (a-min) of the wires formed in the printed wiring board (A) is within a range of ±8% of the average electric resistance (A-ave.) of the wires of the printed wiring board (A).

The printed wiring board group of the present invention is a group of printed wiring boards in which at least two printed wiring boards are disposed, preferably in parallel. According to the printed wiring board group of the present invention, the wires formed in each printed wiring board have a small variation in the electric resistance. Additionally, a difference in the electric resistance is small between one printed wiring board and an adjacent printed wiring board. Accordingly, mounted electronic parts do not malfunction due to varied input electric currents. Further, a variation in output electric currents from the printed wiring board on which the electronic part is mounted is small. Therefore, an electronic apparatus having the printed wiring board group operates very stably.

According to the printed wiring board group of the present invention, the electric resistances of the wires formed in each printed wiring board are adjusted precisely within an extremely narrow range. Further, when a plurality of the printed wiring boards are disposed in parallel, the electric resistances of adjacent printed wiring boards are adjusted precisely within an extremely narrow range.

As described above, the printed wiring boards are sequentially manufactured by using a long composite film in which a layer composed of a conductive metal such as copper is laminated on a long insulating film, and therefore all the printed wiring boards formed are thought to have substantially the same properties. When the printed wiring boards have an identical configuration of wiring pattern, a slight difference in the properties in each printed wiring board has been thought to be negligible. However, even in one printed wiring board, the electric resistances of the wires are not the same. Further, it has been found that, even among the printed wiring boards simultaneously manufactured, the properties thereof are not exactly the same. The slight difference in the properties as described above hardly becomes problematic in a case in which the electric current is low or the printed wiring boards are used separately. However, it has been found that such slight difference in the properties becomes a factor which may change an output current significantly in a case in which a large number of printed wiring boards are disposed in parallel, or the electric current is high. Accordingly, in a case in which a large number of printed wiring boards are disposed in parallel, or the flowing current is high, the use of the printed wiring board group of the present invention enables more stable operation of an electronic apparatus.

The printed wiring board group of the present invention has a structure in which a plurality of printed wiring boards having an identical wiring pattern are disposed, and a variation in the electric resistances of the wires formed in each printed wiring board is small. Accordingly, by using the printed wiring board group of the present invention, input signals to an electronic part and output signals therefrom will be changed uniformly by the electric resistances of the wires.

According to an embodiment of the printed wiring board group of the present invention, a plurality of the printed wiring boards are disposed in parallel in which the electric resistances of the wires in each board are within a constant range as described above. Moreover, in such embodiment, a difference of the electric resistances among the printed wiring boards arranged in parallel is within a specific small range. In particular, a difference of the electric resistances between adjacent outermost wires of adjacent printed wiring boards is within a specific small range. Accordingly, in a display apparatus or the like, it is very unlikely that a difference in brightness or the like is caused due to a difference of the electric resistances in and among the printed wiring boards controlling pixels. Further, in a high-speed computer or the like in which a plurality of semiconductor chips (for example, LSIs, IC chips, or the like) are disposed in parallel, malfunction due to a difference in current of output signals is unlikely.

DESCRIPTION OF THE PREFERRED EMBODIMENTS

Next, the printed wiring board group of the present invention will be concretely described.

A printed wiring board group of the present invention is formed such that two or more printed wiring boards having an identical wiring pattern are disposed in parallel.

Figure 1:
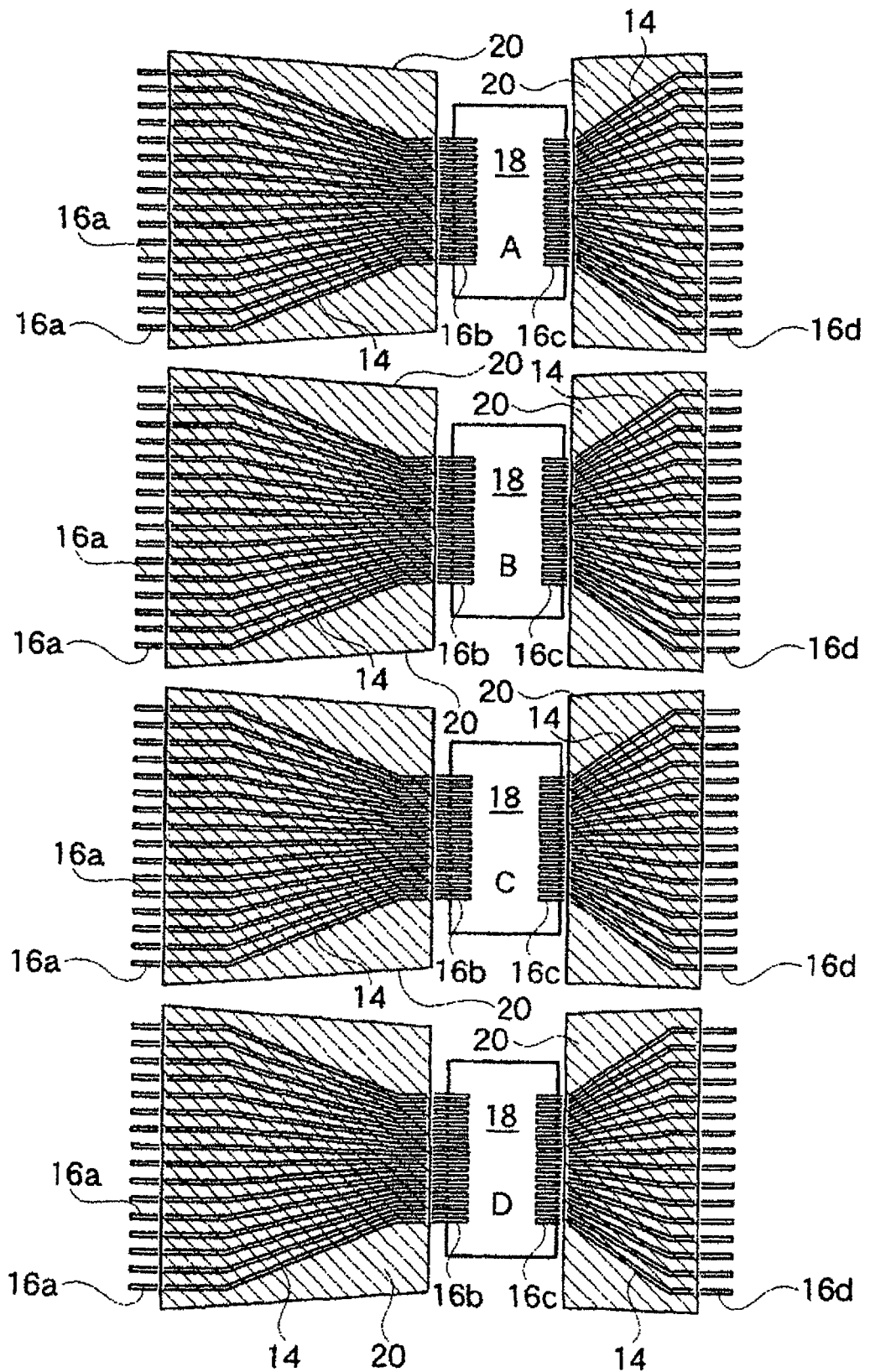
FIG. 1 is a schematic view showing an example of a printed wiring board group of the present invention.
Figure 2:
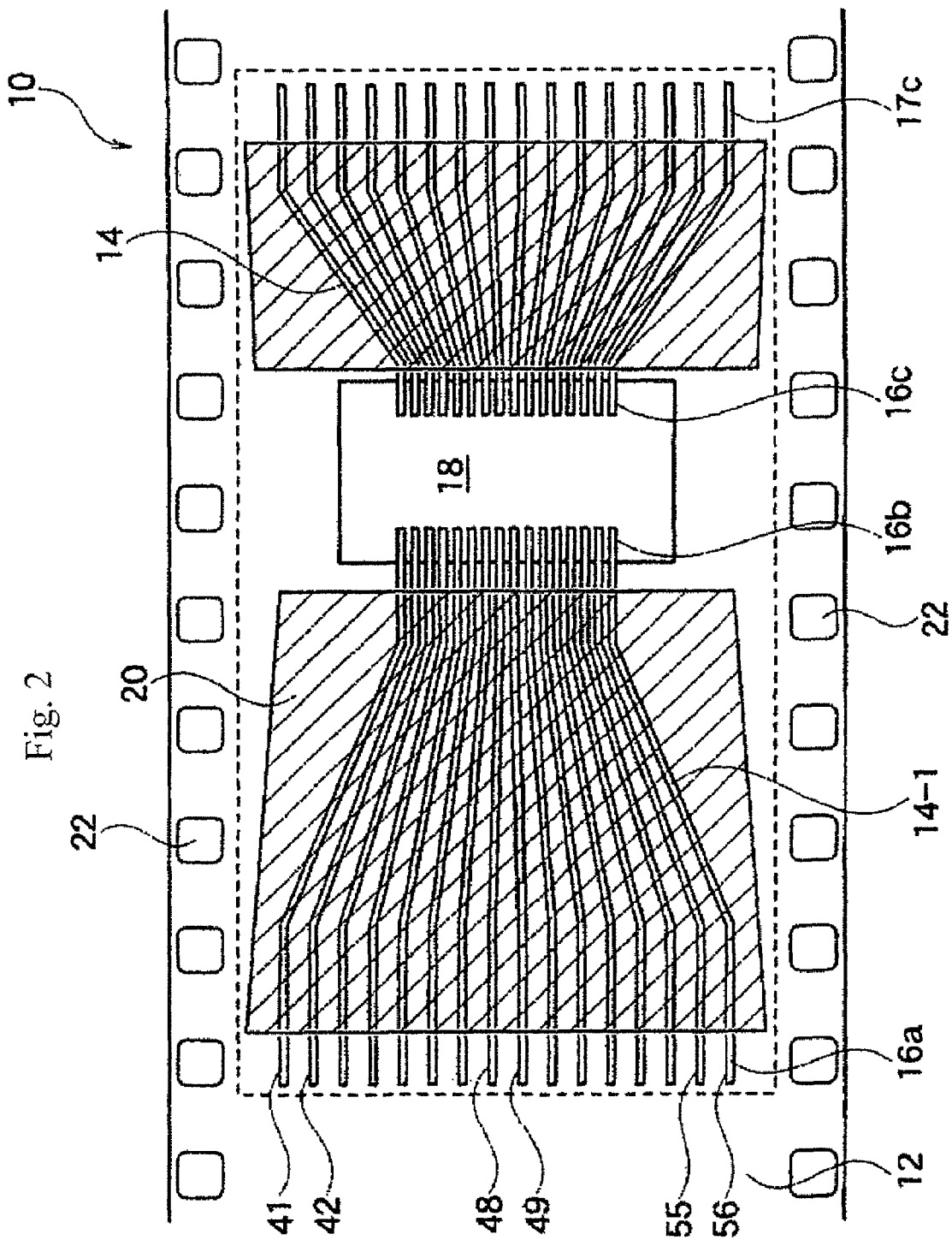
FIG. 2 is a schematic view showing an example of an individual printed wiring board for structuring the printed wiring board group of the present invention.
Figure 3:
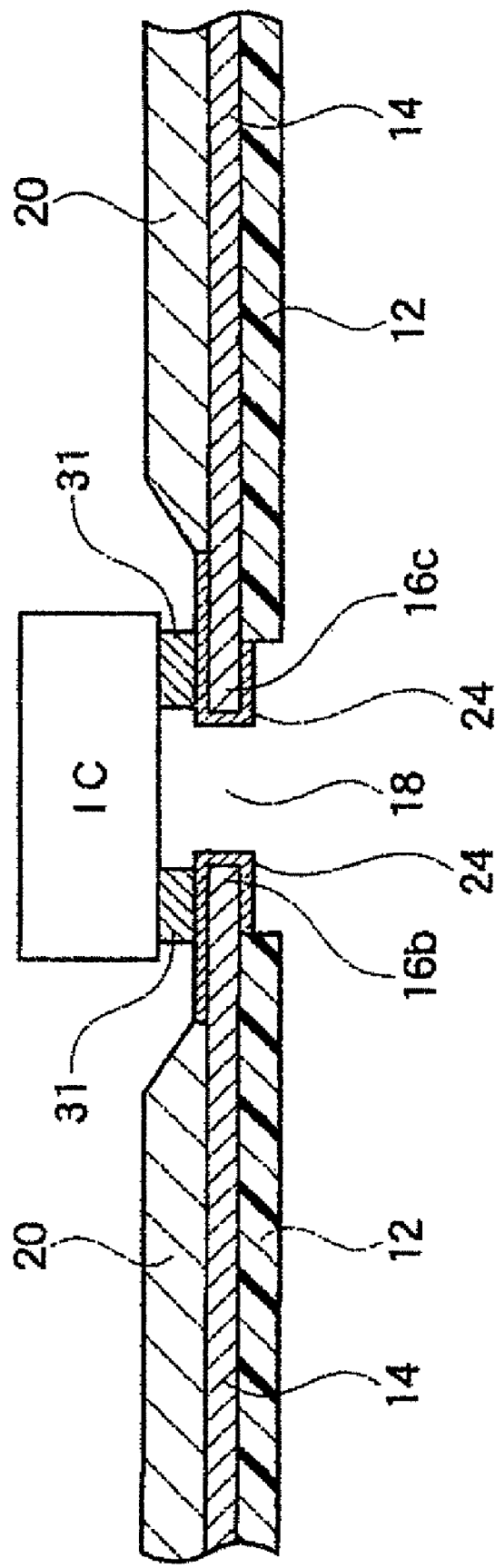
FIG. 3 is a cross-sectional view showing an example of a cross section of the printed wiring board shown in FIG. 2.

FIG. 1 is a view schematically showing one example of the printed wiring board group of the present invention, and four printed wiring boards are shown. FIG. 2 is a plan view of an example of an individual printed wiring board structuring the printed wiring board group shown in FIG. 1, and an example of a cross-sectional view thereof is shown in FIG. 3. Amounted electronic part is omitted in FIG. 2. Note that, in the present invention, unless otherwise mentioned, identical members are denoted by the same reference numeral.

The printed wiring board group of the present invention has a plurality of printed wiring boards A, B, C, and D having an identical wiring pattern as shown in FIG. 1.

In each of the printed wiring boards A, B, C, and D structuring the printed wiring board group shown in FIG. 1, a wiring pattern 14 is formed on an insulating film 12 as shown in FIGS. 2 and 3. In the wiring pattern 14, usually, terminal portions 16b and 16c are provided to be projected above a device hole 18. Other terminal portions 16a and 16d of the wiring pattern 14 are outer leads. A covering layer 20 is formed on the surface of the wiring pattern 14 such that the terminal portions 16a, 16b, 16c, and 16d are exposed. On this printed wiring board, as shown in FIG. 3, an electronic part IC is mounted.

The printed wiring boards A, B, C, and D structuring the printed wiring board group of the present invention will be described in more detail. These printed wiring boards each have, as shown in FIGS. 2 and 3, the wiring pattern 14 formed on the surface of the insulating film 12, and normally have the covering layer 20 to cover the surface of the wiring pattern 14 such that the terminal portions 16a, 16b, 16c, and 16d of the wiring pattern 14 are exposed.

The insulating film 12 of a printed wiring board 10 shown in FIG. 2 is preferably formed from a resin film with heat resistance, and acid resistance and alkaline resistance so as not to be corroded by contact with an etchant, an alkaline cleaning agent or the like in forming the wiring pattern 14. As examples of such resin films with heat resistance, acid resistance, and alkaline resistance, there are polyimide films, polyimide amide films, polyester films, polyphenylene sulfide films, polyether imide films, fluororesin films, liquid crystal polymer films, and the like.

These resin films are not deteriorated even by contact with an acid fluid or alkaline fluid at the time of forming the wiring patterns because they are excellent in acid resistance and alkaline resistance. Further, because these resin films excel in heat resistance, they are stable in a bonding step for packaging electronic parts or in a heating step for hardening a heat sensitive adhesive or a thermosetting resin, and they are not thermally changed even by Joule heat generated when the density of electric current flowing in the printed wiring boards is high. In particular, in the present invention, a polyimide film excellent in the properties such as heat resistance, acid resistance, alkaline resistance, and the like is preferably used as the insulating film 12.

The average thickness of the insulating film 12 is usually 25 to 200 μm, and is preferably 38 to 150 μm, and is particularly preferably 50 to 125 μm. In particular, a relatively thick insulating film is desirably used when the density of electric current flowing in the printed wiring boards is high, in order to prevent the insulating film 12 from being thermally deformed by Joule heat generated, or to increase the heat release from the entire system.

In the insulating film 12 as described above, necessary through-holes may be perforated by perforating means such as a punching device or a laser beam perforating device. The necessary through-holes are sprocket holes 22, the device holes 18 for packaging the electronic parts therein as needed, folding slits (not shown) in a case in which the printed wiring board is folded, alignment holes (not shown), and the like.

The wiring pattern 14 is formed on the surface of the insulating film 12 as described above. The wiring pattern 14 can be formed by selectively etching a conductive metal disposed on the surface of the insulating film 12. Here, copper, copper alloy, aluminum, aluminum alloy, or the like can be used as the conductive metal for forming the wiring pattern 14. In particular, in the printed wiring boards A, B, C, and D structuring the printed wiring board group of the present invention, it is desirable to use copper because its etching characteristics are good, and its electrical resistance is low. Copper has efficient etching characteristics. When copper is used as the conductive metal in forming the wiring pattern 14 by etching, a quantity of remaining metal on the insulating film 12 is small, which makes it possible to reduce the generation of electromigration, ion migration, and the like. Moreover, copper has efficient thermal conductivity and permits good emission of Joule heat generated when a current is applied.

In the present invention, copper as the conductive metal may be disposed as a copper foil on the surface of the insulating film 12. Examples of the copper foils include electrode-posited copper foils and rolled copper foils. In the present invention, any of these copper foils can be used. Such copper foil can be bonded on the surface of the insulating film 12 via a heat-resistant adhesive layer, or can be directly bonded on the insulating film 12 without an adhesive layer. Here, the adhesive used for laminating the copper foil is preferably heat resistant. Such heat-resistant adhesives include epoxy adhesives, polyimide adhesives, thermosetting acrylic adhesives, and the like. The conductive metal can be thermally press bonded via these heat-resistant adhesives. Further, the heat-resistant adhesive used here is preferably a thermosetting adhesive. After such a thermosetting adhesive is hardened, it is not plasticized even by being reheated.

Alternatively to the lamination of the copper foil on the insulating film 12, a synthetic resin material for the insulating film 12 may be directly cast on the surface of the copper foil.

In the printed wiring board group of the present invention, the electric resistances in the wiring pattern formed on each of the printed wiring boards A, B, C, and D are desirably low and constant. Accordingly, copper for forming the wiring patterns 14 is desirably of high purity in order to reduce the electric resistances as much as possible.

In the present invention, the thickness of the conductive metal copper as described above is determined in accordance with the line width of the wiring pattern 14 and the thickness of the wiring pattern 14. The thickness of copper is usually within a range of from 5 to 150 μm, and is preferably within a range of from 8 to 50 μm. By forming the wiring pattern 14 by use of copper with such a thickness, the cross-section area of the wiring pattern 14 can be increased. Even in a case in which a large electric current flows in the wiring pattern 14 with such a large cross-section area, it is possible to reduce the Joule heat generated. In particular, in the present invention, by use of a relatively thick electrodeposited copper foil, it is possible to easily form the wiring pattern 14 with low electric resistances.

The wiring pattern 14 can be manufactured as follows for example. First, a photosensitive resin layer is formed on a layer composed of the conductive metal as described above. The photosensitive resin layer is exposed and developed to a desired shape, thereby forming a pattern composed of the photosensitive resin. The wiring pattern 14 can be manufactured by selectively etching the conductive layer by using this pattern as a masking material. The masking material composed of the photosensitive resin which has been used for the etching can be removed by, for example, alkaline cleaning after the completion of the etching processing.

Figure 4:
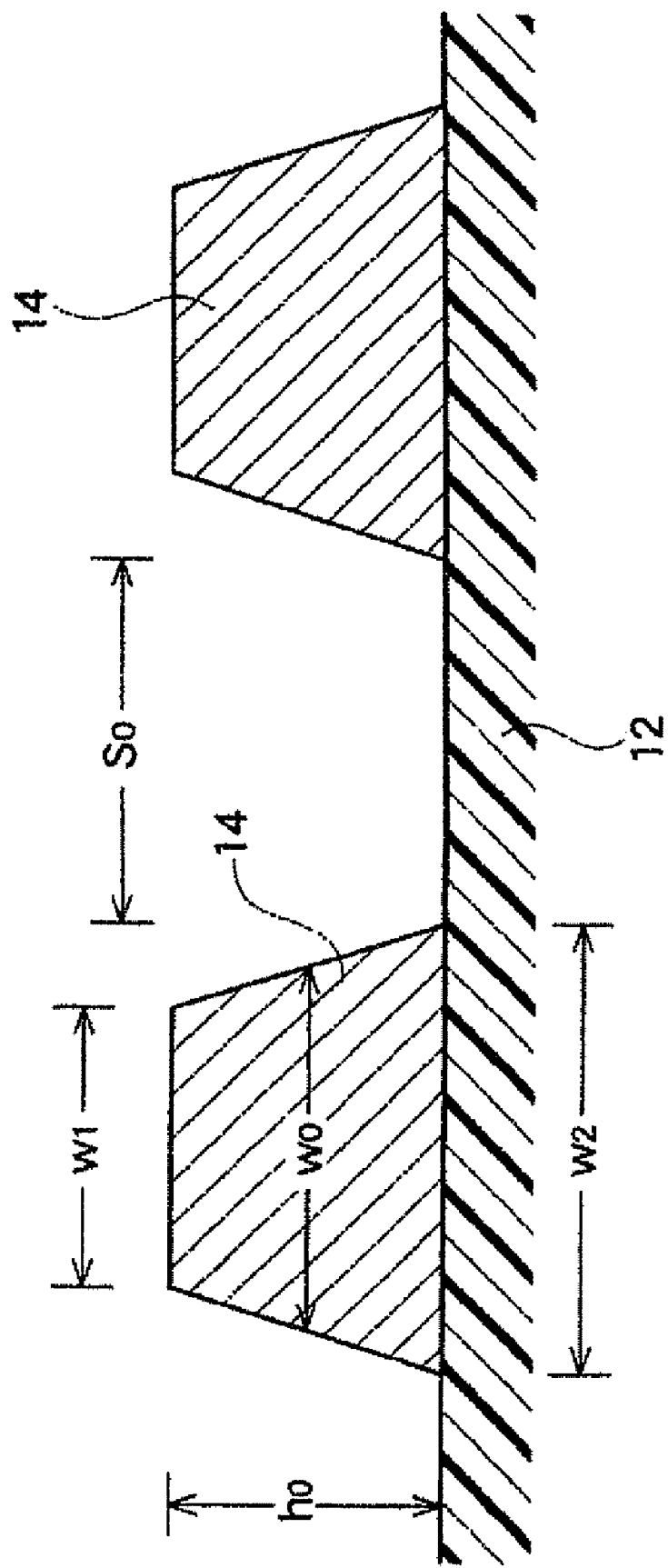
FIG. 4 is a cross-sectional view showing an example of a cross section of wires formed in the printed wiring board structuring the printed wiring board group of the present invention.

The wiring pattern 14 formed on the surface of the insulating film 12 of the printed wiring board 10 as described above has wires that are substantially trapezoidal in cross section as shown in FIG. 4. The height h0 of the wiring pattern 14 is substantially the same as the thickness of the conductive metal used for producing the wiring pattern 14, and is usually within a range of from 5 to 150 μm, and is preferably within a range of from 8 to 50 μm.

Further, the wiring pattern 14 has a substantially trapezoidal cross section as shown in FIG. 4, and a width W1 of the top surface is formed to be narrower than a width W2 of the bottom face. In the present invention, the line width of a wire refers to an average of W1 and W2. Specifically, as shown in FIG. 4, the line width is a value W0 at the midpoint of the cross section of the wiring pattern 14. In the wiring patterns 14 formed in the printed wiring boards A, B, C, and D structuring the printed wiring board group of the present invention, the w1/W2 ratio can be appropriately set. However, the ratio is usually within a range of from 1/5 to 1/1.

In the printed wiring board group of the present invention, a difference (ΔΩ–AB) between an average electric resistance (A-ave.) of wires formed in an arbitrary printed wiring board, for example a printed wiring board (A), and an average electric resistance (B-ave.) of wires formed in a printed wiring board (B) adjacent to the printed wiring board (A) is within a range of ±5%, preferably within a range of ±3.5% of an average electric resistance (AB-ave.) of the wires of the printed wiring board (A) and the printed wiring board (B).

The printed wiring boards structuring the printed wiring board group of the present invention are formed by selectively etching the conductive metal disposed on the long insulating film by use of a photolithography method. The properties of the printed wiring boards are different from one another due to a condition of the etchant, a condition of the conductive metal, the temperature, a condition of the masking material, the positions of wires to be etched, the widths and lengths of the formed wiring patterns, and the like. That is, the printed wiring boards do not always have the same properties. For example, the composition of the etchant is controlled to be constant, and generally about 2000 to 25000 printed wiring boards 10 are manufactured at one time in printed wiring boards of several tens to several hundreds of meters. A large number of the printed wiring boards 10 sequentially manufactured in a series of operations in this way are handled as one lot. The printed wiring boards 10 in one lot are generally produced under relatively uniform manufacturing conditions. Accordingly, the properties of the printed wiring boards 10 tend to be regarded as extremely similar to one another.

However, even in the printed wiring boards 10 manufactured in one lot, a considerable difference in average electric resistance is generated among the anterior half, the midpoint, and the posterior half of the lot. Table 1 below shows examples of the average electric resistances of the printed wiring boards manufactured in three different lots (the first lot, the second lot, and the third lot) wherein the resistance of the wires is set at 180 mΩ. Table 1 shows examples of the average electric resistances of wires in the printed wiring boards manufactured in the anterior half, at the midpoint, and in the posterior half of the respective lots.

TABLE 1

| | Average electric resistance of wiring pattern (mΩ) | | |
| --- | --- | --- | --- |
| | Anterior half of lot | Midpoint of lot | Posterior half of lot |
| Examples of average electric resistances of printed wiring boards in the first lot | 180.67 Symbol: (1-ant.) | 180.00 Symbol: (1-mid.) | 180.33 Symbol: (1-post.) |

TABLE 1-continued

| | Average electric resistance of wiring pattern (mΩ) | | |
|---|---|---|---|
| | Anterior half of lot | Midpoint of lot | Posterior half of lot |
| Examples of average electric resistances of printed wiring boards in the second lot | 183.00 Symbol: (2-ant.) | 183.33 Symbol: (2-mid.) | 181.00 Symbol: (2-post.) |
| Examples of average electric resistances of printed wiring boards in the third lot | 178.00 Symbol: (3-ant.) | 177.67 Symbol: (3-mid.) | 178.33 Symbol: (3-post.) |

As shown in Table 1, even in the individual lot manufactured under the same conditions, the average electric resistances of the printed wiring boards manufactured in the anterior half of the lot and in the middle point or the posterior half are not the same. Moreover, if the lots are different, the average electric resistances of the printed wiring boards are different from one another. For example, when a printed wiring board of symbol: (2-mid.) and a printed wiring board of symbol: (3-mid.) are disposed adjacent to each other, a difference (ΔΩ–AB) between the average electric resistances of the printed wiring board (2-mid.) and the printed wiring board (3-mid.) is 5.66 mΩ. An average electric resistance (AB-ave.) of the printed wiring board (2-mid.) and the printed wiring board (3-mid.) is 180.5 mΩ. The above difference (ΔΩ–AB) of 5.66 mΩ is 3.3% of the average electric resistance (AB-ave.) 180.5 mΩ. This variation is relatively large. On the other hand, for example, when a printed wiring board (1-post.) and a printed wiring board (2-post.) are disposed adjacent to each other, a difference (ΔΩ–AB) between the average electric resistances calculated by the same method as described above is 0.67 mΩ. This difference is as low as 0.37% of an average electric resistance (AB-ave.) 180.67 mΩ of the printed wiring board (1-post.) and the printed wiring board (2-post.).

The above-described combinations are shown as examples of the printed wiring boards adjacent to one another in the printed wiring board group of the present invention. In the printed wiring board group of the present invention, the printed wiring boards are selectively disposed such that a difference (ΔΩ–AB) between an average electric resistance (A-ave.) of wires formed in an arbitrary printed wiring board (A), and an average electric resistance (B-ave.) of wires formed in a printed wiring board (B) disposed adjacent to the printed wiring board (A) is within a range of ±5% of an average electric resistance (AB-ave.) of the wires of the printed wiring board (A) and the printed wiring board (B).

Moreover, the difference ΔΩ–AB is preferably within a range of ±3.5%, particularly preferably within a range of ±2.5% of the AB-ave.

When the difference of the average electric resistances of the adjacent printed wiring boards is within the above-described range, a change in intensity of output signals controlled by each electronic part falls within an allowable range. Accordingly, malfunction does not occur in an electronic apparatus having the electronic parts. In particular, in a case of a display apparatus, a substantial difference is not generated between an area controlled by one electronic part (semiconductor chip) and an area controlled by another electronic part (semiconductor chip) adjacent thereto.

Moreover, in the printed wiring board group of the present invention, the following relation is established between an arbitrary printed wiring board (A) structuring the printed wiring board group, and a printed wiring board (B) adjacent to the printed wiring board (A). A difference (ΔΩ–ab) between an insulation resistance (a-3) between an outer lead and an inner lead of an outermost output wire closest to the printed wiring board (B), of the printed wiring board (A), and an insulation resistance (b-3) between an outer lead and an inner lead of an outermost output wire closest to the printed wiring board (A), of the printed wiring board (B) is within a range of ±11.05%, preferably within a range of ±6.12%, and is particularly preferably within a range of ±6.00% of the average electric resistance (AB-ave.) of the wires of the printed wiring board (A) and the printed wiring board (B). The wires formed in each of the printed wiring boards structuring the printed wiring board group of the present invention have different electric resistances depending on the length, width, and the like. When the width of the wires is the same, the electric resistance is the highest in an outermost wire having the longest length, and the electric resistance sequentially decreases from the outermost wire to inner wires, being the lowest in a central wire having the shortest length. The electric resistance of the wires formed in one printed wiring board is increased in approximate proportion to the length of the wires. Accordingly, in one printed wiring board, the electric resistance of the wires changes approximately sequentially, and will not change irregularly between adjacent wires except for a special case. An example is shown in Table 2 in which a large number of printed wiring boards are sequentially manufactured on a carrier tape in a first lot, a second lot and a third lot, and the printed wiring boards manufactured in the anterior half, the middle point, and the posterior half of each lot are cut out and measured for electric resistance of the wires. For example, in a printed wiring board 2Lm manufactured in the middle point of the second lot, the electric resistance of a leftmost wire of the printed wiring board is 182 mΩ, and the electric resistance of a central wire is 181 mΩ, and the electric resistance of a rightmost wire is 187 mΩ. The average electric resistance of the wires formed in this printed wiring board is 183.3 mΩ.

TABLE 2

| | | | Wires of printed wiring board | | | Average electric |
|---|---|---|---|---|---|---|
| Manufacturing stage in lot | | Symbol | Leftmost wire | Central wire | Rightmost wire | resistance of printed wiring board |
| First lot | Anterior half | 1Lf | 181 | 177 | 180 | 180.7 |
| | Middle point | 1Lm | 181 | 173 | 175 | 180.0 |
| | Posterior half | 1Lb | 180 | 175 | 186 | 180.3 |
| Second lot | Anterior half | 2Lf | 181 | 180 | 188 | 183.0 |
| | Middle point | 2Lm | 182 | 181 | 187 | 183.3 |
| | Posterior half | 2Lb | 183 | 174 | 186 | 181.0 |

TABLE 2-continued

| | Manufacturing stage in lot | Symbol | Wires of printed wiring board | | | Average electric resistance of printed wiring board |
|---|---|---|---|---|---|---|
| | | | Leftmost wire | Central wire | Rightmost wire | |
| Third lot | Anterior half | 3Lf | 178 | 172 | 184 | 178.0 |
| | Middle point | 3Lm | 179 | 170 | 184 | 177.7 |
| | Posterior half | 3Lb | 177 | 169 | 183 | 176.3 |

Note)
Unit of electric resistance is "mΩ".

As shown in Table 2, in the printed wiring boards manufactured by a usual method such that the electric resistance of the wires will be 180 mΩ, a variation in electrical resistances of the wires is generated among the lots (i.e., due to difference in manufacturing conditions) and depending on the manufacturing stage in the lot. Further, even in an individual printed wiring board, the wires have different electric resistances depending on the location.

Figure 5:
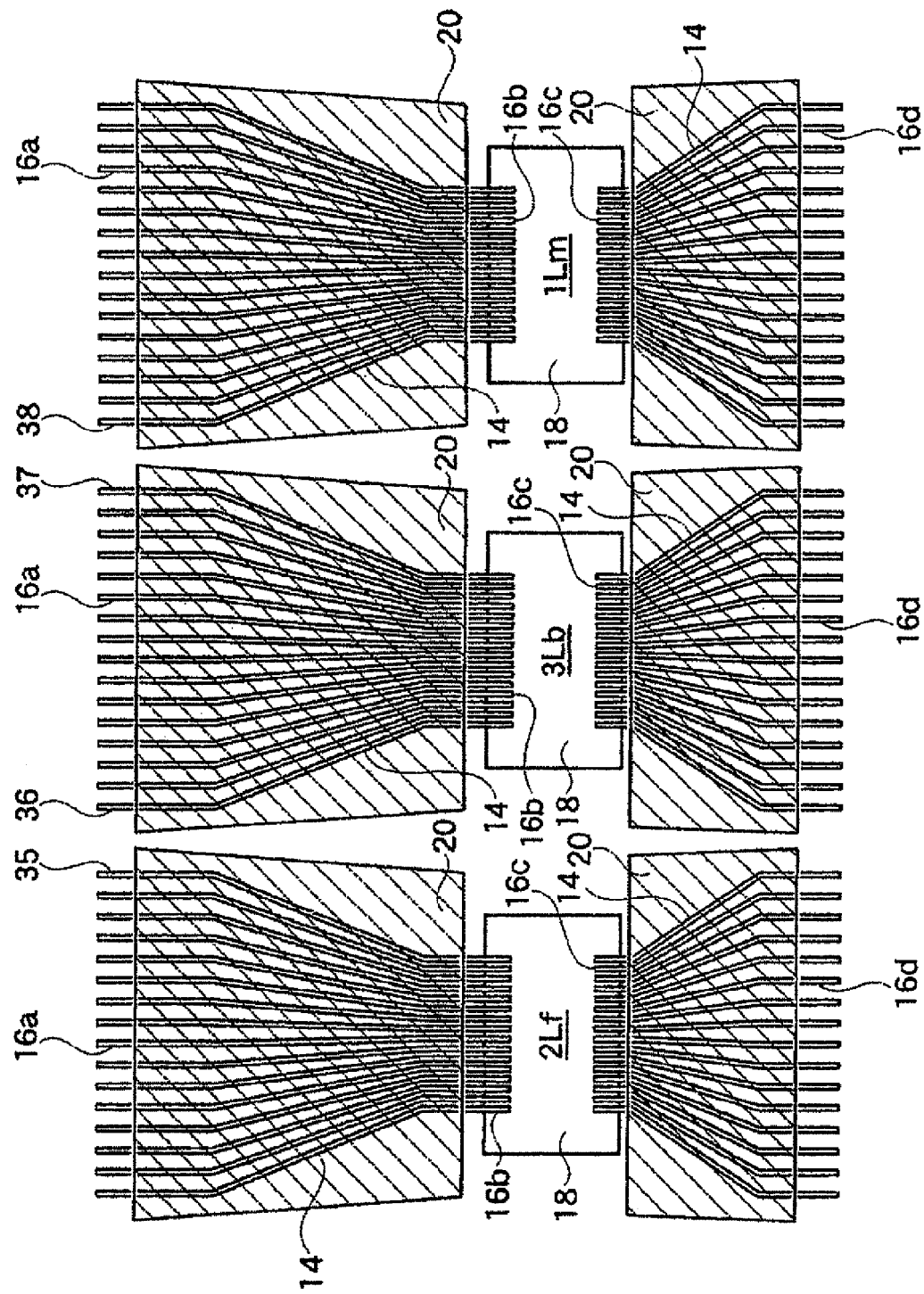
FIG. 5 is a view showing an example of relationship between outermost wires of adjacent printed wiring boards disposed in the printed wiring board group of the present invention.

For example, a printed wiring board 3Lb manufactured in the posterior half of the third lot is disposed at the right side of a printed wiring board 2Lf manufactured in the anterior half of the second lot, as shown in FIG. 5. The electric resistance of a rightmost wire 35 of the printed wiring board 2Lf is 188 mΩ. On the other hand, the electric resistance of a leftmost wire 36 of the printed wiring board 3Lb is 177 mΩ. The difference (ΔΩ-ab) between the electric resistances of the wire 35 and the adjacent wire 36 is 11 mΩ. The average electric resistance of the printed wiring board 2Lf manufactured in the anterior half of the second lot is 183.0 mΩ. The average electric resistance of the printed wiring board 3Lb manufactured in the posterior half of the third lot is 176.3 mΩ. From these values, the average electric resistance (AB-ave.) of the printed wiring board 2Lf and the printed wiring board 3Lb is 179.65 mΩ. The difference (ΔΩ-ab) of 11 mΩ corresponds to 6.12% of the average electric resistance (AB-ave.) of 179.65 mΩ. That is, between the printed wiring board 2Lf and the printed wiring board 3Lb, a relatively large variation of 6.12% in the electric resistances is generated with respect to the average electric resistance of the wires formed in these printed wiring boards.

Further, as shown in FIG. 5, a printed wiring board 1Lm manufactured in the middle point of the first lot is disposed at the right side of the printed wiring board 3Lb manufactured in the posterior half of the third lot. The electric resistance of a rightmost wire 37 of the printed wiring board 3Lb is 183 mΩ. The electric resistance of a leftmost wire 38 of the printed wiring board 1Lm adjacent to the wire 37 is 181 mΩ. The difference (ΔΩ-ab) between the electric resistances of the both wires is 2 mΩ. The average electric resistance of the printed wiring board 3Lb and the printed wiring board 1Lm is 178.15 mΩ which is determined on the basis of the average electric resistance of the printed wiring board 3Lb of 176.3 mΩ and the average electric resistance of the printed wiring board 1Lm of 180.0 mΩ. The difference (ΔΩ-ab) of 2 mΩ corresponds to 1.12% of the average electric resistance (AB-ave.) of 178.15 mΩ. Namely, the difference in electric resistances between the printed wiring board 3Lb and the printed wiring board 1Lm is 1.12% of the average electric resistance of these printed wiring boards. The difference in electric resistances between the printed wiring board 3Lb and the printed wiring board 1Lm is similar to the difference in electric resistances among adjacent wires in each of these printed wiring boards. That is, there is substantially no boundary due to the difference in electric resistances between the printed wiring board 3Lb and the printed wiring board 1Lm.

Figure 6:
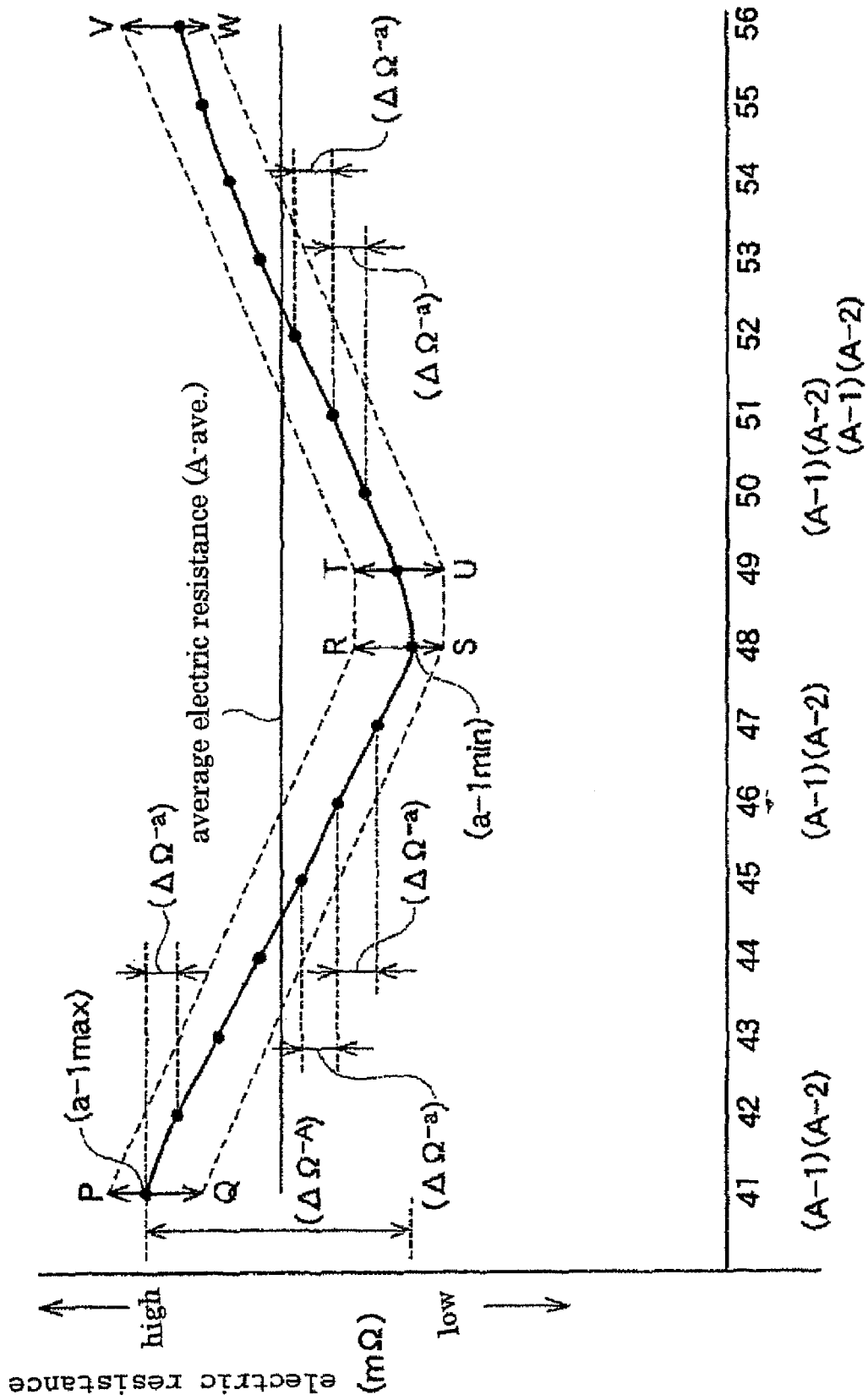
FIG. 6 is a graph showing an example of relationship between the position and the electric resistance of the wires formed in each of the printed wiring boards structuring the printed wiring board group of the present invention.
Figure 7:
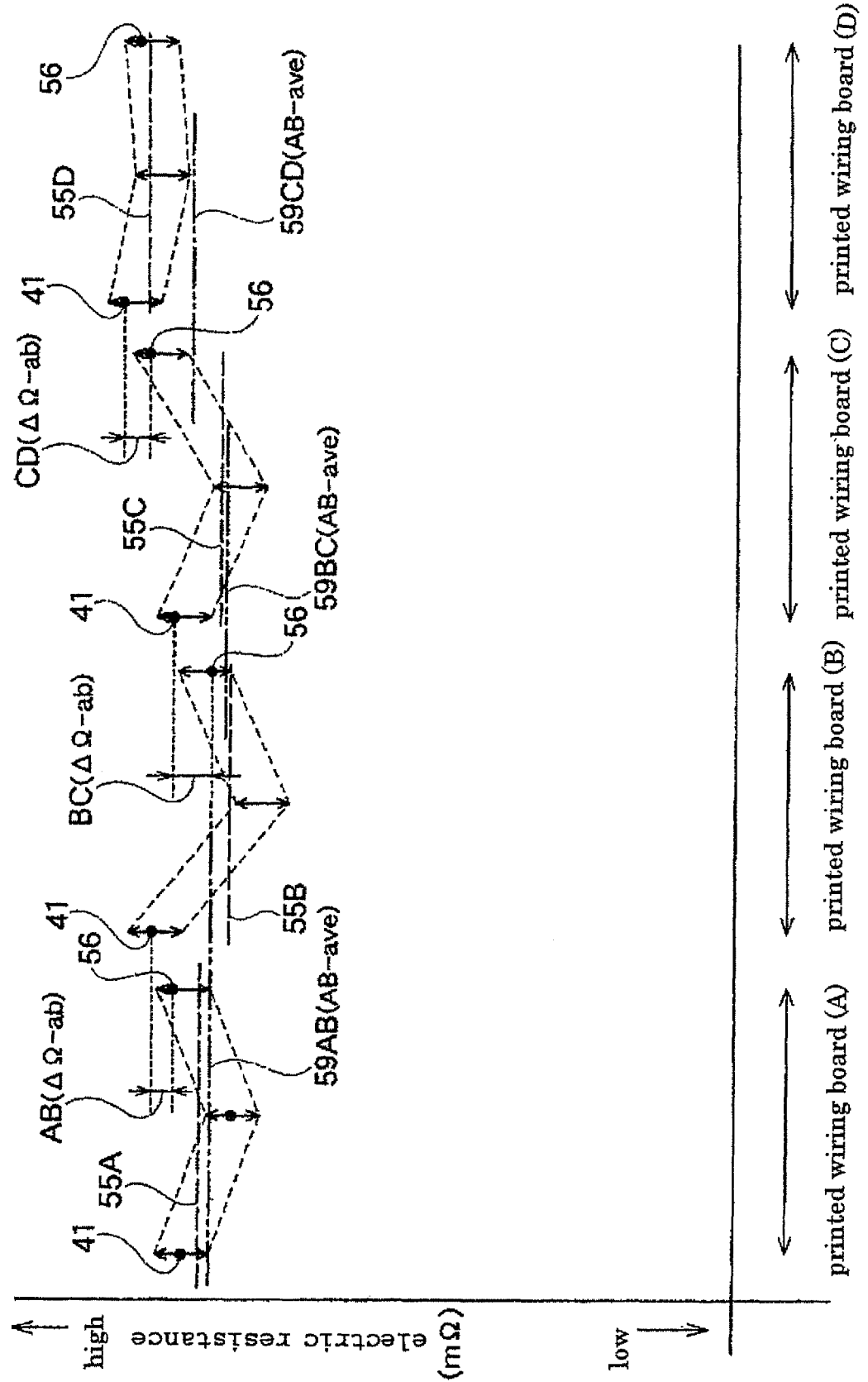
FIG. 7 is a graph showing a relationship among the electric resistances of wires of one printed wiring board and an adjacent printed wiring board structuring the printed wiring board group of the present invention.

As shown in FIG. 7, in the printed wiring board group of the present invention, a plurality of printed wiring boards A to D are disposed in parallel. There is a tendency that the electric resistances of outer wires in each of the printed wiring boards A to D are higher as shown in FIG. 6 or FIG. 7. Further, because the outer wires are most susceptible to etching, the electric resistances thereof are easily changed. In the present invention, the average electric resistances of the wires 14 of adjacent printed wiring boards are within a constant range, and the differences AB (ΔΩ-ab), BC (ΔΩ-ab), and CD (ΔΩ-ab) between the electric resistances of the outermost wires of the adjacent printed wiring boards are within a range of ±11.05%, preferably within a range of ±6.12%, and particularly preferably within a range of ±6.00% of respective average electric resistances 59AB (AB-ave.), 59BC (AB-ave.), and 59CD (AB-ave.) of the wires formed in the adjacent printed wiring boards. Consequently, there is no sharp variation in the electric resistance in the boundaries among the printed wiring boards A to D disposed in parallel, which makes it possible to ensure the continuity of the properties in the boundaries of the printed wiring boards structuring the printed wiring board group of the present invention. Also, an electronic apparatus incorporating the printed wiring board group of the present invention operates stably. Note that reference numeral 41 and reference numeral 56 described in FIG. 7 show the electric resistances of the outermost output wires in, for example, the printed wiring board shown in FIG. 2.

Moreover, in the printed wiring board group of the present invention, the printed wiring boards are manufactured such that the printed wiring boards have the above correlation and each of the wiring patterns has wires having a uniform electric resistance.

In an arbitrary printed wiring board (A) of the plurality of the printed wiring boards structuring the printed wiring board group of the present invention, the following relation is established. A difference (ΔΩ-a) between an electric resistance (a-1) between an outer lead and an inner lead of an arbitrary output wire (A-1) among wires of the printed wiring board (A), and an electric resistance (a-2) between an outer lead and an inner lead of an output wire (A-2) adjacent to the wire (A-1) is within a range of ±6%, preferably within a range of ±4%, and particularly preferably within a range of ±2.5% of an average electric resistance (A-ave.) of the wires of the printed wiring board (A). For example, as shown in FIG. 6, even in the individual printed wiring board, the electric resistances of the wires 14 differ due to various factors such as the length of the wires, etching conditions, and the like. In general, the electric resistance is the lowest in a central wire of the wiring pattern, and is the highest in outermost wires 14 on the both sides. When the electric resistances of the wires formed in each printed wiring board are measured, a V-shaped graph is plotted in which the electric resistance of the central wire is minimum (a-min) and the electric resistances of the outermost wires are maximum (a-max). In the present invention, a difference (ΔΩ–A) between the maximum electric resistance (a-max) and the minimum electric resistance (a-min) of the wires formed in the printed wiring board (A) is within a range of ±8%, preferably within a range of ±7%, and particularly preferably within a range of ±6% of the average electric resistance (A-ave.) of the wires of the printed wiring board (A).

In the printed wiring board (A), for example, as shown in FIG. 2, a large number of the wires 14 are formed whose tip portions are outer leads 16a and 16d, and inner leads 16b and 16c. If the width of the wires 14 is uniform, the longer the wire, the greater the electric resistance (a-1) between the outer lead and the inner lead. Accordingly, when the width of the wires is uniform, a wire 48 and a wire 49 are the shortest in a group of wires (14-1) formed in this printed wiring board 10, and the electric resistances thereof (a-1) show the lowest value. On the other hand, outermost wires 41 and 56 are the longest in the group of wires (14-1) formed in the printed wiring board 10, and the electric resistances thereof (a-1) show the highest value.

FIG. 2 is an example of one printed wiring board used in the printed wiring board group of the present invention.

FIG. 6 is a graph showing examples of the electric resistances between the inner lead 16b and the outer lead 16a of the output wires 41 to 56 of the printed wiring board 10 as shown in FIG. 2. As shown in FIG. 6, a difference (ΔΩ–a) of electric resistances between adjacent wires is within a range of ±6%, and is more preferably within a range of ±4% of an average electric resistance (A-ave.) of the wires in the printed wiring board.

Further, as shown in FIG. 6, a difference between a maximum electric resistance (a-1max) and a minimum electric resistance (a-1min) of the wires formed in the printed wiring board (A) is preferably small. As described above, in the individual printed wiring board, the wires are the shortest near the center and are sequentially longer as they are located outward. When the width of the wires is the same, the electric resistances of the wires are increased in proportion to the length. Accordingly, the outermost wires generally have the highest electric resistance and central wire has the lowest electric resistance. Therefore, the maximum electric resistance (a-1max) in the printed wiring board (A) is generally possessed by either of the outermost wires, and the minimum electric resistance (a-1min) is generally possessed by a central wire. Accordingly, a difference (ΔΩ–A) between a maximum electric resistance (a-max) and a minimum electric resistance (a-min) of the wires formed in the printed wiring board (A) is usually a difference of electric resistances of an outermost wire and a central wire. The difference (ΔΩ–A) between the maximum electric resistance (a-max) and the minimum electric resistance (a-min) is within a range of ±8%, preferably within a range of ±7% thereof, and particularly preferably within a range of ±6% of the average electric resistance (A-ave.) of the wires formed in the printed wiring board (A). That the difference (ΔΩ–A) between the maximum electric resistance (a-max) and the minimum electric resistance (a-min) is small relative to the average electric resistance (A-ave.) means that a difference (ΔΩ–a) between electric resistances of adjacent wires among the wires 41 to 56 shown in FIG. 6 is small, and when the electric resistances of the wires are plotted, the plots fall on an approximately flat line similar to the straight line showing the average electric resistance (A-ave.). Further, referring to FIG. 6, the differences (ΔΩ–a) between electric resistances of adjacent wires, for example wires 41 and 42, wires 46 and 47, wires 50 and 51, and wires 51 and 52 are within a range of 6%, preferably within a range of ±4%, and particularly preferably within a range of ±2.5% of the average electric resistance (A-ave.). Consequently, the electric resistances of the wires are plotted to fall on a line similar to the straight line showing the average electric resistance (A-ave.) of the wires formed in the printed wiring board (A). As described, arbitrary adjacent wires in the printed wiring board have similar electric resistances. Consequently, input signals to a mounted electronic part or output signals therefrom will not be attenuated by the wire resistance, and malfunction is prevented. Further, even when an electric current flowing in the wires is large, the Joule heat generated by the electric resistances of the wires is small. Therefore, even when the packaging density of the electronic parts is high, the heat generated from the electronic parts is low and will not adversely affect the operation of the electronic apparatus, permitting stable operation of the electronic apparatus for a long term.

In particular, in a display apparatus, a relatively high electric current is often applied for activating the pixels of the display apparatus. For example, attention has been recently drawn to field emission displays such as a surface-conduction electron-emitter display which uses surface conduction electron emitters, and display apparatuses which produce brightness by emitting electrons such as electrons emitted from carbon nanotubes. In such displays, a high current is applied for emitting electrons efficiently, and it is expected that the heating value from the energized wires will be far greater than in a conventional printed wiring board. Further, when electronic parts (LSIs or IC chips) in which circuits are highly integrated are disposed in parallel to perform a high-speed operation, it is expected that a considerably high electric current will be applied to the wires.

As described above, when a high electric current flows in wires, there will be not only heat generation from the mounted electronic parts, but also a considerably large quantity of Joule heat due to the electric resistance of the wires formed in the printed wiring board on which the electronic parts are mounted. Accordingly, for the electronic apparatus to operate more stably, it is preferable that the wires are formed such that the electric resistances of adjacent wires are within the above-described range. The printed wiring boards structuring the printed wiring board group of the present invention are formed as descried above by etching the conductive metal layer disposed on the insulating film with use of a desired mask. The electric resistance of wire is inversely proportional to the cross-sectional area of the wire formed from the conductive metal layer. Therefore, when the thickness of the conductive metal layer is uniform, the electric resistance varies inversely to the line width. Further, when the cross-sectional area of the wires is uniform, the electric resistance of wire is increased in proportion to the wire length. Further, when the wires are formed by contact with an etchant, outermost wires have a higher frequency of contact with the etchant than central wires. Consequently, even when the wires are formed aiming at a uniform width, there is a tendency that the outermost wires are slightly thinner than the central wires. Moreover, because the outermost wires are the longest in general, the outermost wires and neighboring wires will have a maximum electric resistance in the printed wiring board (A).

Accordingly, by eliminating factors causing the high electric resistance of the outermost wires, a difference of electric resistances of the outermost wires and central wires is reduced.

For example, regarding the fact that the outermost wires have a high frequency of contact with the etchant, a dummy pattern may be disposed at an outer side of the outermost wires to control the amount of the etchant contacting the outermost wires, thereby preventing the thinning of the outermost wires.

Further, although not shown in FIG. 2, in the printed wiring board, a dummy pattern-forming region is frequently provided at a central part of the wiring pattern 14. Normally, a dummy pattern is formed in order to prevent the printed wiring board from being thermally deformed. However, a dummy pattern is not necessarily formed at this dummy pattern-forming region, and a central wire may be formed in an increased length by being bent in the dummy pattern-forming region. By adjusting the length of the inner wires in this way, it is possible to uniform the electric resistances of the wires.

Moreover, the photosensitive resin may be exposed and developed into a masking material in which the cured resin parts are arranged such that the width thereof is sequentially increased from the central to the outermost resin parts. By etching the conductive metal using this masking material, wires may be produced in which the width is sequentially increased from the central to the outermost wires. Consequently, the electric resistance per unit length of the wires is gradually reduced from the central wire toward the outermost wires, and the electric resistances of the wires become uniform.

Furthermore, after the conductive metal layer with a uniform thickness is etched, conductive metal layers having a different thickness may be formed on the surface of the wires at multiple stages using a mask. Consequently, the thickness of the wires may be gradually increased from the central wire to the outermost wires, and the electric resistance of the wires except the terminals may be adjusted.

Further, because the outer wires in the wiring pattern most frequently have the maximum electric resistance, a metal with high conductivity may be partly deposited in the vicinity of the ends of the wiring pattern so that the conductive metal forming the outer wires and the deposited metal will be mutually diffused, thereby reducing the electric resistance of the outer wires. By reducing the maximum electric resistance, the difference between the maximum electric resistance and the minimum electric resistance may be decreased.

The difference ($\Delta\Omega$–A) between the maximum electric resistance (a-1max) and the minimum electric resistance (a-1min) of the wires forming the wiring pattern is reduced by decreasing the difference ($\Delta\Omega$–a) between the electric resistances of adjacent wires (A-1) and (A-2) in the printed wiring board. As a result, an average of the actual electric resistances of the printed wiring board actually manufactured may be approximated to an electric resistance set when the printed wiring board is designed.

In the production of the printed wiring boards, the composition of the etchant, the etching conditions such as temperature, and the like are strictly managed, and the quality control is sufficiently performed with respect to the conductive metal.

As described above, the electric resistances of the wires formed in each of the printed wiring boards structuring the printed wiring board group of the present invention are uniformed, and consequently the variation in the electric resistances is reduced among the printed wiring boards. As a result, adjacent printed wiring boards may be easily selected for manufacturing the printed wiring board group of the present invention.

In each printed wiring board formed as described above, the electric resistance of a wire between an outer lead and an inner lead may be different depending on the electronic part to be mounted, the electronic apparatus to be operated, and the like. However, the electric resistance is usually 30 m$\Omega$ to 300 m$\Omega$, and is preferably 100 m$\Omega$ to 200 m$\Omega$.

Further, an electric current may be generally applied at 0.1 mA to 2.0 A, and preferably 100 mA to 1.7 A to each of the wires of the printed wiring boards structuring the printed wiring board group of the present invention.

In the wires formed in the respective printed wiring boards structuring the printed wiring board group of the present invention, a variation in the electric resistances is small as described above. Accordingly, even when a current density is high, the quantity of Joule heat by energization is small and a variation in Joule heat is small among the wires. Consequently, heat is not unevenly distributed in the printed wiring board group in the energization, and the Joule heat generated can be efficiently released.

The printed wiring board group of the present invention may be manufactured by selectively arranging a plurality of printed wiring boards from the printed wiring boards produced as described above so that the properties of the printed wiring board group can be achieved. The respective printed wiring boards structuring the printed wiring board group of the present invention have the properties as described above, and electronic parts are mounted on these printed wiring boards.

The printed wiring board group of the present invention may be used in a display apparatus. In some display apparatuses, a high current of about 0.5 to 2.0 A is applied in order to operate the display apparatus. Even when such a large current is applied, an increase in temperature due to the Joule heat may be suppressed in a temperature range at which the electronic parts can operate. This advantage is achieved when the electric resistance per unit length of the wires in the respective printed wiring boards structuring the printed wiring board group of the present invention is within a range of from 0.016 to 7.0 $\Omega$/cm, and preferably within a range of from 0.11 to 2.1 $\Omega$/cm. In general, the upper limit of the temperature for operation of the electronic parts is about 120° C. When the electric resistance per unit length of the wires is within the above-described range, even when the current density is high, the temperature of the printed wiring board group of the present invention can be kept at an environmental temperature plus 35° C. or less, and preferably at an environmental temperature plus 15° C. or less, specifically at a temperature of 100° C. or less, and preferably at a temperature of 85° C. or less.

In the respective printed wiring boards 10 structuring the printed wiring board group of the present invention, the wiring pattern 14 is the densest in the inner leads, in particular output inner leads. The line width W0 of a narrowest wire in the wiring pattern 14 is within a range of from 5 to 70 μm, and preferably within a range of from 10 to 30 μm. Specifically, the line width W1 of the top surface of the narrowest wire in the wiring pattern 14 is usually within a range of 5 to 60 μm, and preferably 10 to 30 μm, and the line width W2 of the bottom face is usually within a range of 5 to 80 μm, and preferably 10 to 60 μm.

Moreover, in the respective printed wiring boards 10 structuring the printed wiring board group of the present invention, a distance S0 between adjacent wires in the densest area is usually within a range of 10 to 60 μm, and preferably 30 to 60 μm. When the distance S0 between adjacent wires is as described above, ion migration is prevented. Moreover, when the wires are formed with such a density, the quantity of heat stored in the printed wiring board group of the present invention can be reduced, and a peak temperature of the printed wiring board group in energization can be kept at an environmental temperature plus 35° C. or less, and preferably at an environmental temperature plus 15° C. or less.

Figure 8:
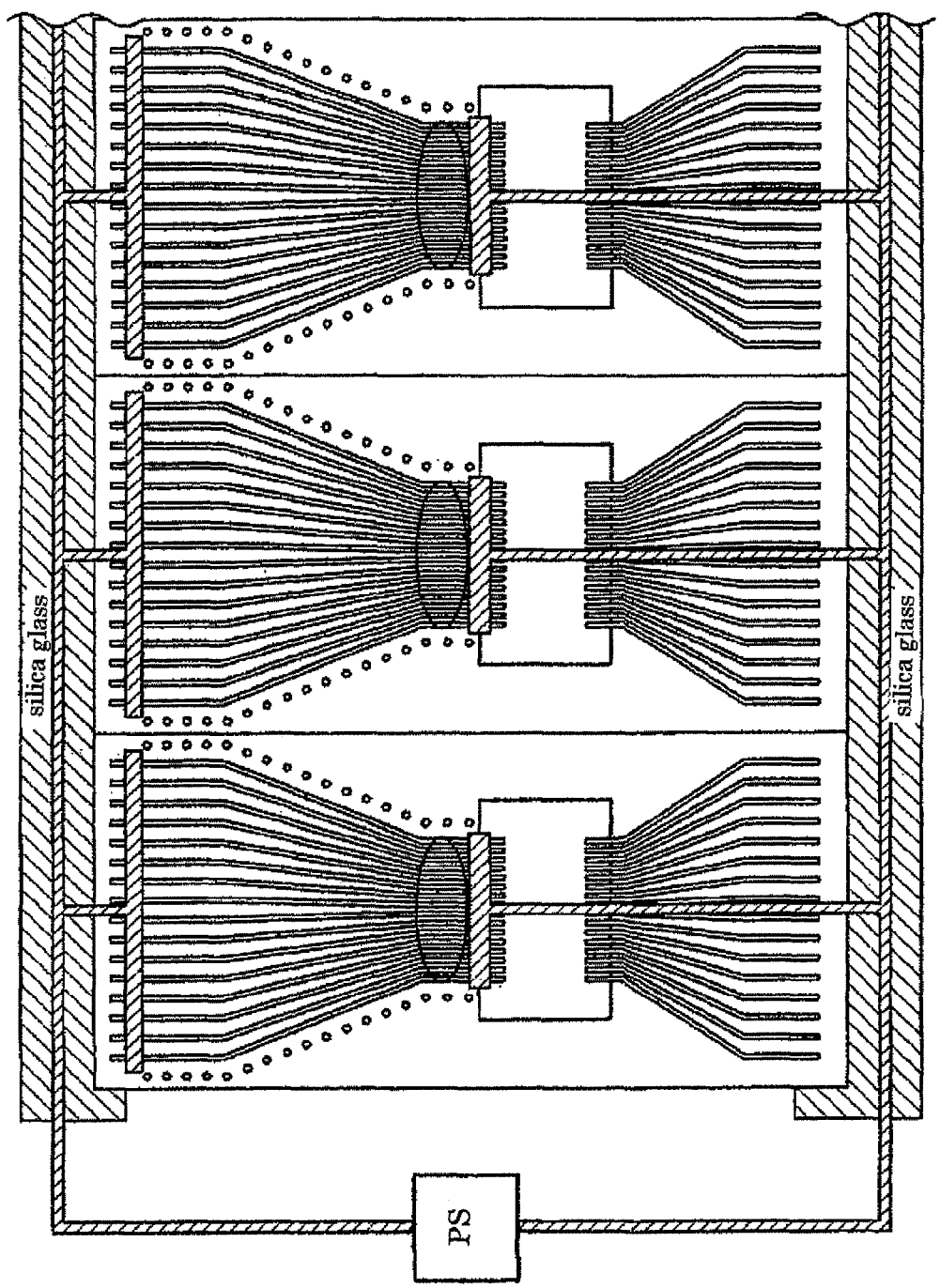
FIG. 8 is a view schematically showing a circuit for measuring a heating value when a current is applied to the printed wiring board group of the present invention.

The peak temperature may be measured as illustrated in FIG. 8 for example, in which a heating value is measured by applying an electric current of 0.5 to 2.0 A to the wires surrounded by dots in FIG. 8. Specifically, as shown in FIG. 8, the printed wiring boards structuring the printed wiring board group have output outer leads, and output inner leads formed in device holes. The both ends of the printed wiring boards are placed on quartz glass. Next, electrodes are disposed to the output outer leads and the output inner leads of the printed wiring boards. Then, a peak temperature is measured by energizing the wiring boards in a thermal insulation case. Although three printed wiring boards are shown in FIG. 8, as described above, the printed wiring board group of the present invention has a plurality of the printed wiring boards. Accordingly, in the actual measurement, a plurality of the printed wiring boards are arranged and energized for measurement of the heating value, and the value obtained is multiplied correspondingly to the number of the printed wiring boards structuring the printed wiring board group. Thus, the heating value of the printed wiring board group is obtained.

The wiring pattern 14 formed as described above is covered with a covering layer 20 while the both ends of the wires are exposed as terminals 16a, 16b, 16c, and 16d. This covering layer 20 may be a solder resist layer formed by screen printing an insulating resin, or may be a coverlayer film provided by attaching an insulating resin film cut to a desired shape. The covering layer 20 such as a solder resist layer or a coverlayer film on the wiring pattern provides increased heat release of the printed wiring boards.

The thickness of the covering layer 20 is usually within a range of from 10 to 70 μm, and is preferably within a range of from 12 to 50 μm. When the surface of the wiring pattern 14 is covered, electromigration or ion migration from the wiring pattern 14 is prevented. The covering layer 20 may have a uniform thickness. Further, as shown in FIG. 3, the covering layer 20 may be formed such that the thickness of the covering layer is reduced toward the marginal portion of the covering layer 20. Further, in a case in which the printed wiring board group of the present invention is folded for use, the thickness of the covering layer at the folding portion of each printed wiring board may be changed from the thickness of other area.

The covering layer 20 can be formed of a resin such as an epoxy resin, a polyimide resin, a urethane resin, or a urethane-modified polyimide resin. Further, when the covering layer 20 is a coverlayer film, the resin as described above can be used as an insulating resin. An adhesive resin can be used for bonding the film of such insulating resin. As examples of the adhesive resins, there are epoxy adhesives, acrylic adhesives, urethane adhesives, and the like.

The areas of the wiring pattern 14 exposed from the covering layer 20 are the terminals 16a, 16b, 16c, and 16d. The terminals 16a, 16b, 16c, and 16d are plated as shown in FIG. 3 in order to establish good electrical connections to electrodes 31 of the electronic part, or terminals formed on a glass substrate. In FIG. 3, plating layers 24 are formed on the surfaces of the inner leads 16b and 16c as the terminals extending above the device hole 18. Further, bump electrodes 31 formed on the electronic part (IC chip) are electrically connected to the inner leads 16b and 16c via the plating layers 24.

As examples of the plating layers formed on the terminals 16a, 16b, 16c, and 16d, there are a tin-plating layer, a gold-plating layer, a nickel-plating layer, a nickel-gold-plating layer, a solder-plating layer, a lead-free solder-plating layer, and the like. The thickness of the plating layer 24 is usually within a range of from 0.2 to 15 μm, and is preferably within a range of from 0.3 to 10 μm. The plating layer is not necessarily a single layer, and may be a laminate of plating layers composed of different metals, or may be a laminate of plating layers composed of the same metal. For example, after the wiring pattern 14 is formed, a thin tin-plating layer (preliminary tin-plating layer: usually with a thickness of 0.01 to 0.1 μm) may be formed on the entire surface of the wiring pattern 14, and the covering layer 20 is formed, and a plating layer (main plating layer: usually with a thickness of 0.2 to 0.5 μm) may be formed on the terminals.

A plurality of the printed wiring boards 10 as described above are disposed, preferably in parallel, to produce the printed wiring board group of the present invention.

In the printed wiring board group of the present invention, even when a large current is applied in order to operate an electronic apparatus, the quantity of Joule heat is suppressed and the Joule heat generated can be released efficiently.

The printed wiring board group of the present invention can be used in uses where a large number of electronic parts are arranged in parallel as in a display apparatus. Further, the printed wiring board group of the present invention can be used very advantageously in uses where a plurality of identical electronic parts are operated in parallel such as in a dual-processor built-in personal computer or the like.

Embodiment

Next, the printed wiring board group of the present invention will be described by showing an embodiment. However, the present invention is not limited thereto.

[Manufacture of TAB Tape in First Lot]

A polyimide film tape (UPILEX-S manufactured by UBE INDUSTRIES LTD.) with a thickness of 75 μm, a width of 70 mm, and a length of 100 m had a thermosetting adhesive layer thereon. Sprocket holes were perforated on the both marginal portions in the width direction of the tape by using a punching device. Device holes for packaging electronic parts were formed in the center of the tape.

An electrodeposited copper foil with an average thickness of 35 μm was disposed and thermally press bonded onto the polyimide film tape to manufacture a laminate of the polyimide film and the electrodeposited copper foil.

Next, a photosensitive resin was applied onto the surface of the electrodeposited copper foil of the laminate, and a resist was applied from the rear face side to protect the electrodeposited copper foil on the device holes. The photosensitive resin layer was exposed and developed into a pattern composed of the photosensitive resin. A large number of dummy patterns were formed outside the resin parts corresponding to outermost wires so that the outermost wires would not be excessively etched. In the resin pattern, the line width was sequentially increased from central to outermost parts.

Wiring patterns were formed by etching the electrodeposited copper foil in accordance with the ordinary method using the patterns as a masking material. Next, the masking material and the resist layers in the device holes were removed by alkaline cleaning.

A urethane-modified solder resist ink was screen printed in a thickness of 26 μm such that the both ends of the wires of the wiring patterns were exposed. The solder resist ink was cured by heating to give solder resist layers.

Next, tin-plating layers with a thickness of 0.5 μm were formed on the terminals exposed from the solder resist layers. Thus, printed wiring boards were manufactured.

The TAB tape having the printed wiring boards formed as described above was used as a first lot.

In the first lot production of the printed wiring boards, the etching was strictly controlled by sampling the etchant two times more frequently than normal.

A printed wiring board 1Lf positioned at a distance of 5 m from the head of the TAB tape in the first lot was cut out, and electric resistances of the wires were measured. The electric resistance of the leftmost wire was 181 mΩ, that of the central wire was 177 mΩ, and that of the rightmost wire was 180 mΩ. Further, electric resistances of wires formed in the printed wiring board 1Lf were measured. The largest difference between electric resistances was 22.8 mΩ, and the smallest difference between electric resistances was 0 mΩ. The average electric resistance of the wires formed in the printed wiring board 1Lf was 180.7 mΩ. Accordingly, the largest difference was 12.6% of the average electric resistance.

Next, a printed wiring board 1Lm positioned at a distance of 50 m from the head of the TAB tape in the first lot was cut out. Because the TAB tape in the first lot was 100 m long, the printed wiring board 1Lm was positioned at the middle of the first lot.

Electric resistances of the wires formed in the printed wiring board 1Lm were measured in the same way as described above. The electric resistance of the leftmost wire was 181 mΩ, that of the central wire was 173 mΩ, and that of the rightmost wire was 175 mΩ. Further, electric resistances of wires formed in the printed wiring board 1Lm were measured. The largest difference between electric resistances was 21 mΩ, and the smallest difference between electric resistances was 0 mΩ. The average electric resistance of the wires formed in the printed wiring board 1Lm was 180.0 mΩ. Accordingly, the largest difference was 11.7% of the average electric resistance.

Moreover, a printed wiring board 1Lb positioned at a distance of 95 m from the head of the TAB tape in the first lot, i.e., at a distance of 5 m from the back end of the TAB tape in the first lot was cut out. Because the TAB tape in the first lot was 100 m long, the printed wiring board 1Lb was positioned at a posterior side of the first lot.

Electric resistances of the wires formed in the printed wiring board 1Lb were measured in the same way as described above. The electric resistance of the leftmost wire was 180 mΩ, that of the central wire was 175 mΩ, and that of the rightmost wire was 186 mΩ. Further, electric resistances of wires formed in the printed wiring board 1Lb were measured. The largest difference between electric resistances was 20 mΩ, and the smallest difference between electric resistances was 0 mΩ. The average electric resistance of the wires formed in the printed wiring board 1Lb was 180.3 mΩ. Accordingly, the largest difference was 11.1% of the average electric resistance.

In the first lot, the differences ΔΩ–A were all within a range of ±8% of the average electric resistance A-ave., and the differences ΔΩ–a were all within a range of ±6% of the average electric resistance A-ave.

[Manufacture of TAB Tape in Second Lot]

A TAB tape with a length of 100 m was manufactured in the same way as in manufacturing the TAB tape in the first lot. The printed wiring boards formed on the TAB tape had the same pattern shape as that of the printed wiring boards formed on the TAB tape in the first lot.

The TAB tape having the printed wiring boards formed as described above was used as a second lot.

A printed wiring board 2Lf positioned at a distance of 5 m from the head of the TAB tape in the second lot was cut out, and electric resistances of the wires were measured. The electric resistance of the leftmost wire was 181 mΩ, that of the central wire was 180 mΩ, and that of the rightmost wire was 188 mΩ. Further, electric resistances of wires formed in the printed wiring board 2Lf were measured. The largest difference between electric resistances was 19 mΩ, and the smallest difference between electric resistances was 0 mΩ. The average electric resistance of the wires formed in the printed wiring board 2Lf was 183.0 mΩ. Accordingly, the largest difference was 10.4% of the average electric resistance.

Next, a printed wiring board 2Lm positioned at a distance of 50 m from the head of the TAB tape in the second lot was cut out. Because the TAB tape in the second lot was 100 m long, the printed wiring board 2Lm was positioned at the middle of the second lot.

Electric resistances of the wires formed in the printed wiring board 2Lm were measured in the same way as described above. The electric resistance of the leftmost wire was 182 mΩ, that of the central wire was 181 mΩ, and that of the rightmost wire was 187 mΩ. Further, electric resistances of wires formed in the printed wiring board 2Lm were measured. The largest difference between electric resistances was 21 mΩ, and the smallest difference between electric resistances was 0 mΩ. The average electric resistance of the wires formed in the printed wiring board 2Lm was 183.3 mΩ. Accordingly, the largest difference was 11.4% of the average electric resistance.

Moreover, a printed wiring board 2Lb positioned at a distance of 95 m from the head of the TAB tape in the second lot, i.e., at a distance of 5 m from the back end of the TAB tape in the second lot was cut out. Because the TAB tape in the second lot was 100 m long, the printed wiring board 2Lb was positioned at a posterior side of the second lot.

Electric resistances of the wires formed in the printed wiring board 2Lb were measured in the same way as described above. The electric resistance of the leftmost wire was 183 mΩ, that of the central wire was 174 mΩ, and that of the rightmost wire was 186 mΩ. Further, electric resistances of wires formed in the printed wiring board 2Lb were measured. The largest difference between electric resistances was 20 mΩ, and the smallest difference between electric resistances was 0 mΩ. The average electric resistance of the wires formed in the printed wiring board 2Lb was 181.0 mΩ. Accordingly, the largest difference was 11.0% of the average electric resistance.

In the second lot, the differences ΔΩ–A were all within a range of ±8% of the average electric resistance A-ave., and the differences ΔΩ–a were all within a range of ±6% of the average electric resistance A-ave.

[Manufacture of TAB Tape in Third Lot]

A third lot TAB tape with a length of 100 m was manufactured in the same way as in manufacturing the TAB tape in the first lot. The printed wiring boards formed in the TAB tape in the third lot had the same pattern shape as that of the printed wiring boards formed in the TAB tape in the first lot.

The TAB tape having the printed wiring boards formed as described above was used as a third lot.

A printed wiring board 3Lf positioned at a distance of 5 m from the head of the TAB tape in the third lot was cut out, and electric resistances of the wires were measured. The electric resistance of the leftmost wire was 178 mΩ, that of the central wire was 172 mΩ, and that of the rightmost wire was 184 mΩ. Further, electric resistances of wires formed in the printed wiring board 3Lf were measured. The largest difference between electric resistances was 19 mΩ, and the smallest difference between electric resistances was 0 mΩ. The average electric resistance of the wires formed in the printed wiring board 3Lf was 173.0 mΩ. Accordingly, the largest difference was 11.0% of the average electric resistance.

Next, a printed wiring board 3Lm positioned at a distance of 50 m from the head of the TAB tape in the third lot was cut out. Because the TAB tape in the third lot was 100 m long, the printed wiring board 3Lm was positioned at the middle of the third lot.

Electric resistances of the wires formed in the printed wiring board 3Lm were measured in the same way as described above. The electric resistance of the leftmost wire was 179 mΩ, that of the central wire was 170 mΩ, and that of the rightmost wire was 184 mΩ. Further, electric resistances of wires formed in the printed wiring board 3Lm were measured. The largest difference between electric resistances was 20 mΩ, and the smallest difference between electric resistances was 0 mΩ. The average electric resistance of the wires formed in the printed wiring board 3Lm was 177.7 mΩ. Accordingly, the largest difference was 11.3% of the average electric resistance.

Moreover, a printed wiring board 3Lb positioned at a distance of 95 m from the head of the TAB tape in the third lot, i.e., at a distance of 5 m from the back end of the TAB tape in the third lot was cut out. Because the TAB tape in the third lot was 100 m long, the printed wiring board 3Lb was positioned at a posterior side of the third lot.

Electric resistances of the wires formed in the printed wiring board 3Lb were measured in the same way as described above. The electric resistance of the leftmost wire was 177 mΩ, that of the central wire was 169 mΩ, and that of the rightmost wire was 183 mΩ. Further, electric resistances of wires formed in the printed wiring board 3Lb were measured. The largest difference between electric resistances was 21 mΩ, and the smallest difference between electric resistances was 0 mΩ. The average electric resistance of the wires formed in the printed wiring board 3Lb was 176.3 mΩ. Accordingly, the largest difference was 11.9% of the average electric resistance.

In the third lot, the differences ΔΩ−A were all within a range of ±8% of the average electric resistance A-ave., and the differences ΔΩ−a were all within a range of ±6% of the average electric resistance A-ave.

[Manufacture of TAB Tape in Fourth Lot]

A fourth lot TAB tape with a length of 100 m was manufactured in the same way as in manufacturing the TAB tape in the first lot. The printed wiring boards formed in the TAB tape in the fourth lot had the same pattern shape as that of the printed wiring boards formed in the TAB tape in the first lot. However, the etchant was managed and temperature-controlled in a similar manner to the usual etching process of printed wiring boards. Further, the patterns composed of cured photosensitive resin had a uniform width.

The TAB tape having the printed wiring boards formed as described above was used as a fourth lot.

A printed wiring board 4Lf positioned at a distance of 5 m from the head of the TAB tape in the fourth lot was cut out, and electric resistances of the wires were measured. The electric resistance of the leftmost wire was 180 mΩ, that of the central wire was 160 mΩ, and that of the rightmost wire was 181 mΩ. Further, electric resistances of wires formed in the printed wiring board 4Lf were measured. The largest difference between electric resistances was 31 mΩ, and the smallest difference between electric resistances was 0 mΩ. The average electric resistance of the wires formed in the printed wiring board 4Lf was 173.7 mΩ. Accordingly, the largest difference was 17.8% of the average electric resistance.

Next, a printed wiring board 4Lm positioned at a distance of 50 m from the head of the TAB tape in the fourth lot was cut out. Because the TAB tape in the fourth lot was 100 m long, the printed wiring board 4Lm was positioned at the middle of the fourth lot.

Electric resistances of the wires formed in the printed wiring board 4Lm were measured in the same way as described above. The electric resistance of the leftmost wire was 195 mΩ, that of the central wire was 163 mΩ, and that of the rightmost wire was 188 mΩ. Further, electric resistances of wires formed in the printed wiring board 4Lm were measured. The largest difference between electric resistances was 37 mΩ, and the smallest difference between electric resistances was 0 mΩ. The average electric resistance of the wires formed in the printed wiring board 4Lm was 182.0 mΩ. Accordingly, the largest difference was 20.3% of the average electric resistance.

Moreover, a printed wiring board 4Lb positioned at a distance of 95 m from the head of the TAB tape in the fourth lot, i.e., at a distance of 5 m from the back end of the TAB tape in the fourth lot was cut out. Because the TAB tape in the fourth lot was 100 m long, the printed wiring board 4Lb was positioned at a posterior side of the fourth lot.

Electric resistances of the wires formed in the printed wiring board 4Lb were measured in the same way as described above. The electric resistance of the leftmost wire was 165 mΩ, that of the central wire was 145 mΩ, and that of the rightmost wire was 162 mΩ. Further, electric resistances of wires formed in the printed wiring board 4Lb were measured. The largest difference between electric resistances was 28 mΩ, and the smallest difference between electric resistances was 0 mΩ. The average electric resistance of the wires formed in the printed wiring board 4Lb was 157.3 mΩ. Accordingly, the largest difference was 17.8% of the average electric resistance.

In the fourth lot, the differences ΔΩ−A were all out of the range of ±8% of the average electric resistance A-ave.

TABLE 3

|  |  |  | Wires in printed wiring board | | | Average electric |
|  |  | Symbol | Leftmost wire | Central wire | Rightmost wire | resistance of printed wiring board |
| --- | --- | --- | --- | --- | --- | --- |
| First lot | Anterior | 1Lf | 181 | 177 | 180 | 180.7 |
|  | Middle | 1Lm | 181 | 173 | 175 | 180.0 |
|  | Posterior | 1Lb | 180 | 175 | 186 | 180.3 |
| Second lot | Anterior | 2Lf | 181 | 180 | 188 | 183.0 |
|  | Middle | 2Lm | 182 | 181 | 187 | 183.3 |
|  | Posterior | 2Lb | 183 | 174 | 186 | 181.0 |
| Third lot | Anterior | 3Lf | 178 | 172 | 184 | 178.0 |
|  | Middle | 3Lm | 179 | 170 | 184 | 177.7 |
|  | Posterior | 3Lb | 177 | 169 | 183 | 176.3 |

TABLE 3-continued

|  |  | Symbol | Wires in printed wiring board | | | Average electric resistance of printed wiring board |
|---|---|---|---|---|---|---|
|  |  |  | Leftmost wire | Central wire | Rightmost wire |  |
| Fourth lot | Anterior | 4Lf | 180 | 160 | 181 | 173.7 |
|  | Middle | 4Lm | 195 | 163 | 188 | 182.0 |
|  | Posterior | 4Lb | 165 | 145 | 162 | 157.3 |

Note)
Unit of electric resistance is "mΩ".

Four printed wiring boards were selected from among the printed wiring boards manufactured as described above to manufacture the printed wiring board group of the present invention.

<Manufacture of Printed Wiring Board Group 1 According to Embodiment of the Present Invention>

A printed wiring board group 1 of the present invention was manufactured by selectively arranging the printed wiring board 1Lf, the printed wiring board 1Lm, and the printed wiring board 1Lb from the first lot, and the printed wiring board 2Lf from the second lot as follows.

Arrangement of Printed Wiring Boards: 1Lf/1Lm/1Lb/2Lf

The difference between the average electric resistances of the printed wiring boards 1Lf and 1Lm in the printed wiring board group 1 was 0.7 mΩ.

This difference in the average electric resistances=0.7 mΩ corresponded to 0.39% of the average electric resistance of the printed wiring boards 1Lf and 1Lm.

The difference between the electric resistances of the rightmost wire of the printed wiring board 1Lf and the leftmost wire of the printed wiring board 1Lm in the printed wiring board group 1 was 1 mΩ.

This difference in the electric resistances=1 mΩ corresponded to 0.55% of the average electric resistance of the printed wiring boards 1Lf and 1Lm.

The difference between the average electric resistances of the printed wiring boards 1Lm and 1Lb in the printed wiring board group 1 was 0.3 mΩ.

This difference in the average electric resistances=0.3 mΩ corresponded to 0.17% of the average electric resistance of the printed wiring boards 1Lm and 1Lb.

The difference between the electric resistances of the rightmost wire of the printed wiring board 1Lm and the leftmost wire of the printed wiring board 1Lb in the printed wiring board group 1 was 5 mΩ.

This difference in the electric resistances=5 mΩ corresponded to 2.78% of the average electric resistance of the printed wiring boards 1Lm and 1Lb.

The difference between the average electric resistances of the printed wiring boards 1Lb and 2Lf in the printed wiring board group 1 was 2.7 mΩ.

This difference in the average electric resistances=2.7 mΩ corresponded to 1.49% of the average electric resistance of the printed wiring boards 1Lb and 2Lf.

The difference between the electric resistances of the rightmost wire of the printed wiring board 1Lb and the leftmost wire of the printed wiring board 2Lf in the printed wiring board group 1 was 5 mΩ.

This difference in the electric resistances=5 mΩ corresponded to 2.75% of the average electric resistance of the printed wiring boards 1Lb and 2Lf.

In the printed wiring board group 1, the differences ΔΩ–AB were all within a range of ±5% of the average electric resistance AB-ave., and the differences ΔΩ–ab were all within a range of +11.05% of the average electric resistance AB-ave.

<Manufacture of Printed Wiring Board Group 2 According to Embodiment of the Present Invention>

A printed wiring board group 2 of the present invention was manufactured by selectively arranging the printed wiring board 2Lf and the printed wiring board 2Lb from the second lot, and the printed wiring board 3Lb and the printed wiring board 3Lf from the third lot as follows.

Arrangement of Printed Wiring Boards: 2Lf/3Lb/3Lf/2Lb

The difference between the average electric resistances of the printed wiring boards 2Lf and 3Lb in the printed wiring board group 2 was 6.7 mΩ.

This difference in the average electric resistances=6.7 mΩ corresponded to 3.73% of the average electric resistance of the printed wiring boards 2Lf and 3Lb.

The difference between the electric resistances of the rightmost wire of the printed wiring board 2Lf and the leftmost wire of the printed wiring board 3Lb in the printed wiring board group 2 was 11 mΩ.

This difference in the electric resistances=11 mΩ corresponded to 6.12% of the average electric resistance of the printed wiring boards 2Lf and 3Lb.

The difference between the average electric resistances of the printed wiring boards 3Lb and 3Lf in the printed wiring board group 2 was 1.7 mΩ.

This difference in the average electric resistances=1.7 mΩ corresponded to 0.96% of the average electric resistance of the printed wiring boards 3Lb and 3Lf.

The difference between the electric resistances of the rightmost wire of the printed wiring board 3Lb and the leftmost wire of the printed wiring board 3Lf in the printed wiring board group 2 was 5 mΩ.

This difference in the electric resistances=5 mΩ corresponded to 2.82% of the average electric resistance of the printed wiring boards 3Lb and 3Lf.

The difference between the average electric resistances of the printed wiring boards 3Lf and 2Lb in the printed wiring board group 2 was 3.0 mΩ.

This difference in the average electric resistances=3.0 mΩ corresponded to 1.67% of the average electric resistance of the printed wiring boards 3Lf and 2Lb.

The difference between the electric resistances of the rightmost wire of the printed wiring board 3Lf and the leftmost wire of the printed wiring board 2Lb in the printed wiring board group 2 was 1 mΩ.

This difference in the electric resistances=1 mΩ corresponded to 0.56% of the average electric resistance of the printed wiring boards 3Lf and 2Lb.

In the printed wiring board group 2, the differences ΔΩ–AB were all within a range of ±5% of the average electric resistance AB-ave., and the differences ΔΩ–ab were all within a range of ±11.05% of the average electric resistance AB-ave.

<Manufacture of Printed Wiring Board Group 3 According to Embodiment of the Present Invention>

A printed wiring board group 3 of the present invention was manufactured by selectively arranging the printed wiring board 1Lm from the first lot, the printed wiring board 2Lf from the second lot, the printed wiring board 3Lb from the third lot, and the printed wiring board 4Lm from the fourth lot as follows.

Arrangement of Printed Wiring Boards: 1Lm/4Lm/3Lm/2Lf

The difference between the average electric resistances of the printed wiring boards 1Lm and 4Lm in the printed wiring board group 3 of the present invention was 2.0 mΩ.

This difference in the average electric resistances=2.0 mΩ corresponded to 1.10% of the average electric resistance of the printed wiring boards 1Lm and 4Lm.

The difference between the electric resistances of the rightmost wire of the printed wiring board 1Lm and the leftmost wire of the printed wiring board 4Lm in the printed wiring board group 3 was 20 mΩ.

This difference in the electric resistances=20 mΩ corresponded to 11.05% of the average electric resistance of the printed wiring boards 1Lm and 4Lm.

The difference between the average electric resistances of the printed wiring boards 4Lm and 3Lm in the printed wiring board group 3 was 4.3 mΩ.

This difference in the average electric resistances=4.3 mg corresponded to 2.39% of the average electric resistance of the printed wiring boards 4Lm and 3Lm.

The difference between the electric resistances of the rightmost wire of the printed wiring board 4Lm and the leftmost wire of the printed wiring board 3Lm in the printed wiring board group 3 was 9 mΩ.

This difference in the electric resistances=9 mΩ corresponded to 5.00% of the average electric resistance of the printed wiring boards 4Lm and 3Lm.

The difference between the average electric resistances of the printed wiring boards 3Lm and 2Lf in the printed wiring board group 3 was 5.3 mΩ.

This difference in the average electric resistances=5.3 mΩ corresponded to 2.94% of the average electric resistance of the printed wiring boards 3Lm and 2Lf.

The difference between the electric resistances of the rightmost wire of the printed wiring board 3Lm and the leftmost wire of the printed wiring board 2Lf in the printed wiring board group 3 was 3 mΩ.

This difference in the electric resistances=3 mΩ corresponded to 1.66% of the average electric resistance of the printed wiring boards 3Lm and 2Lf.

In the printed wiring board group 3, the differences ΔΩ–AB were all within a range of ±5% of the average electric resistance AB-ave., and the differences ΔΩ–ab were all within a range of ±11.05% of the average electric resistance AB-ave.

<Manufacture of Printed Wiring Board Group 4 According to Comparative Embodiment of the Present Invention>

A printed wiring board group 4 was manufactured by selectively arranging the printed wiring boards 4Lb, 4Lm, and 4Lf from the fourth lot, and the printed wiring board 2Lm from the second lot as follows.

Arrangement of Printed Wiring Boards: 4Lb/4Lm/4Lf/2Lm

The difference between the average electric resistances of the printed wiring boards 4Lb and 4Lm in the printed wiring board group 4 was 24.7 mΩ.

This difference in the average electric resistances=24.7 mΩ corresponded to 14.6% of the average electric resistance of the printed wiring boards 4Lb and 4Lm, and was out of the range of ±5% defined in the present invention.

The difference between the electric resistances of the rightmost wire of the printed wiring board 4Lb and the leftmost wire of the printed wiring board 4Lm in the printed wiring board group 4 was 33 mΩ.

This difference in the electric resistances=33 mΩ corresponded to 19.5% of the average electric resistance of the printed wiring boards 4Lb and 4Lm, and was out of the range of ±11.05% defined in the present invention.

The difference between the average electric resistances of the printed wiring boards 4Lm and 4Lf in the printed wiring board group 4 was 8.3 mΩ.

This difference in the average electric resistances=8.3 mΩ corresponded to 4.67% of the average electric resistance of the printed wiring boards 4Lm and 4Lf.

The difference between the electric resistances of the rightmost wire of the printed wiring board 4Lm and the leftmost wire of the printed wiring board 4Lf in the printed wiring board group 4 was 8 mΩ.

This difference in the electric resistances=8 mΩ corresponded to 4.52% of the average electric resistance of the printed wiring boards 4Lm and 4Lf.

The difference between the average electric resistances of the printed wiring boards 4Lf and 2Lm in the printed wiring board group 4 was 9.6 mΩ.

This difference in the average electric resistances=9.6 mΩ corresponded to 5.38% of the average electric resistance of the printed wiring boards 4Lf and 2Lm, and was out of the range of ±5% defined in the present invention.

The difference between the electric resistances of the rightmost wire of the printed wiring board 4Lf and the leftmost wire of the printed wiring board 2Lm in the printed wiring board group 4 was 1 mΩ.

This difference in the electric resistances=1 mΩ corresponded to 0.55% of the average electric resistance of the printed wiring boards 4Lf and 2Lm.

In the printed wiring board group 4, the differences ΔΩ–AB and ΔΩ–ab were out of the ranges defined in the present invention.

As can be seen, the printed wiring boards arranged in the printed wiring board group 4 had a great difference in the electric resistances. Therefore, even if constant input signals are applied, outputs can change by 15% or more between the printed wiring boards. If the printed wiring board group 4 is used in a display apparatus for example, brightness can change among the printed wiring boards. Further, when the printed wiring board group 4 is used in a computer in which a plurality of IC chips are disposed in parallel, varied output currents can cause operation errors.

With respect to the printed wiring board groups manufactured above, electrodes were disposed on the printed wiring boards and the ends of the printed wiring boards were placed on quartz glass, as shown in FIG. 8. The printed wiring boards together with the quartz glass were placed in a heat insulating measurement case having thermocouple. Next, the temperature was stabilized by applying an electric current of 0.5 to 2.0 A from the electrodes for 30 minutes. The electric current was continuously applied under the same conditions, and the temperature of the energized area was measured by the thermocouple. As a result, the temperatures at the areas shown by the ellipses in FIG. 8 were the highest. However, the peak temperature was an environmental temperature 85° C. plus 15° C. or less.

After the measurements were carried out as described above, the used printed wiring board groups were observed in detail. However, the printed wiring boards had no meltdown in the wiring patterns due to the Joule heat, change in quality of the insulating film, breakage of the IC chips, separation of the wiring patterns, deformation of the printed wiring boards due to thermal stress, changes in composition, changes in the resistances of the wiring patterns, electromigration, ion migration, dielectric breakdown due to leak current, and the like.

The printed wiring board group of the present invention has a structure in which a plurality of the printed wiring boards are disposed in parallel, and adjacent printed wiring boards have specific electrical properties. The printed wiring boards structuring the printed wiring board group of the present invention have similar properties, and therefore output signals are uniform and an electronic apparatus can operate stably. Further, in the printed wiring board group of the present invention, the wires have a small variation in electric resistances. Accordingly, there is no case in which a quantity of Joule heat is increased in a specific wiring board during energization, and the heat generated is dispersed in the printed wiring board group and is efficiently released. Therefore, the printed wiring board group of the present invention can be used favorably in a case in which a large number of identical electronic parts are disposed in parallel. An electronic apparatus using the printed wiring board group can operate stably for a long time.

What is claimed is:

1. A printed wiring board group that comprises a plurality of printed wiring boards having a wiring pattern of a large number of wires composed of a conductive metal on a surface of an insulating film, wherein
   a difference ($\Delta\Omega$–AB) between an average electric resistance (A-ave.) of wires formed in one printed wiring board (A) and an average electric resistance (B-ave.) of wires formed in a printed wiring board (B) adjacent to the printed wiring board (A) is within a range of ±5% of an average electric resistance (AB-ave.) of the wires of the printed wiring board (A) and the printed wiring board (B), and
   a difference ($\Delta\Omega$–ab) between an electric resistance (a-3) between an outer lead and an inner lead of an outermost wire closest to the printed wiring board (B), of the printed wiring board (A), and an electric resistance (b-3) between an outer lead and an inner lead of an outermost wire closest to the printed wiring board (A), of the printed wiring board (B) is within a range of ±11.05% of the average electric resistance (AB-ave.) of the wires of the printed wiring board (A) and the printed wiring board (B).

2. The printed wiring board group described in claim 1, wherein
   a difference ($\Delta\Omega$–a) between an electric resistance (a-1) between an outer lead and an inner lead of an arbitrary wire (A-1) among a large number of the wires of the printed wiring board (A), and an electric resistance (a-2) between an outer lead and an inner lead of a wire (A-2) adjacent to the wire (A-1) is within a range of ±6% of the average electric resistance (A-ave.) of the wires of the printed wiring board (A), and
   a difference ($\Delta\Omega$–A) between a maximum electric resistance (a-max) and a minimum electric resistance (a-min) of the wires formed in the printed wiring board (A) is within a range of ±8% of the average electric resistance (A-ave.) of the wires of the printed wiring board (A).

3. The printed wiring board group described in claim 1, wherein an electronic part is mounted on each of the printed wiring boards structuring the printed wiring board group.

4. The printed wiring board group described in claim 1, wherein an electric current flowing in the respective printed wiring boards structuring the printed wiring board group is within a range of 0.1 mA to 2.0 A.

5. The printed wiring board group described in claim 1, wherein a difference of electric resistances between an outer lead and an inner lead of each wire formed in the respective printed wiring boards structuring the printed wiring board group is within a range of 30 m$\Omega$ to 300 m$\Omega$.

6. The printed wiring board group described in claim 1, wherein the printed wiring boards are at least three in number, have an identical wiring pattern, and are disposed in parallel.

7. The printed wiring board group described in claim 2, wherein an electronic part is mounted on each of the printed wiring boards structuring the printed wiring board group.

8. The printed wiring board group described in claim 2, wherein an electric current flowing in the respective printed wiring boards structuring the printed wiring board group is within a range of 0.1 mA to 2.0 A.

9. A printed wiring board group that comprises a plurality of printed wiring boards having a wiring pattern of a large number of wires composed of a conductive metal on a surface of an insulating film, wherein
   a difference ($\Delta\Omega$–AB) between an average electric resistance (A-ave.) of wires formed in one printed wiring board (A) and an average electric resistance (B-ave.) of wires formed in a printed wiring board (B) adjacent to the printed wiring board (A) is within a range of ±5% of an average electric resistance (AB-ave.) of the wires of the printed wiring board (A) and the printed wiring board (B), and
   a difference ($\Delta\Omega$–ab) between an electric resistance (a-3) between an outer lead and an inner lead of an outermost wire closest to the printed wiring board (B), of the printed wiring board (A), and an electric resistance (b-3) between an outer lead and an inner lead of an outermost wire closest to the printed wiring board (A), of the printed wiring board (B) is within a range of ±6.12% of the average electric resistance (AB-ave.) of the wires of the printed wiring board (A) and the printed wiring board (B).

10. The printed wiring board group described in claim 9, wherein
    a difference ($\Delta\Omega$–a) between an electric resistance (a-1) between an outer lead and an inner lead of an arbitrary wire (A-1) among a large number of the wires of the printed wiring board (A), and an electric resistance (a-2) between an outer lead and an inner lead of a wire (A-2) adjacent to the wire (A-1) is within a range of ±6% of the average electric resistance (A-ave.) of the wires of the printed wiring board (A), and
    a difference ($\Delta\Omega$–A) between a maximum electric resistance (a-max) and a minimum electric resistance (a-min) of the wires formed in the printed wiring board (A) is within a range of ±8% of the average electric resistance (A-ave.) of the wires of the printed wiring board (A).

11. The printed wiring board group described in claim 9, wherein an electronic part is mounted on each of the printed wiring boards structuring the printed wiring board group.

12. The printed wiring board group described in claim 9, wherein an electric current flowing in the respective printed wiring boards structuring the printed wiring board group is within a range of 0.1 mA to 2.0 A.

13. The printed wiring board group described in claim 9, wherein a difference of electric resistances between an outer lead and an inner lead of each wire formed in the respective printed wiring boards structuring the printed wiring board group is within a range of 30 m$\Omega$ to 300 m$\Omega$.

14. The printed wiring board group described in claim 9, wherein the printed wiring boards are at least three in number, have an identical wiring pattern, and are disposed in parallel.

15. A printed wiring board group that comprises a plurality of printed wiring boards having a wiring pattern of a large number of wires composed of a conductive metal on a surface of an insulating film, wherein
- a difference ($\Delta\Omega$–AB) between an average electric resistance (A-ave.) of wires formed in one printed wiring board (A) and an average electric resistance (B-ave.) of wires formed in a printed wiring board (B) adjacent to the printed wiring board (A) is within a range of ±5% of an average electric resistance (AB-ave.) of the wires of the printed wiring board (A) and the printed wiring board (B), and
- a difference ($\Delta\Omega$–ab) between an electric resistance (a-3) between an outer lead and an inner lead of an outermost wire closest to the printed wiring board (B), of the printed wiring board (A), and an electric resistance (b-3) between an outer lead and an inner lead of an outermost wire closest to the printed wiring board (A), of the printed wiring board (B) is within a range of ±6% of the average electric resistance (AB-ave.) of the wires of the printed wiring board (A) and the printed wiring board (B).

16. The printed wiring board group described in claim 15, wherein
- a difference ($\Delta\Omega$–a) between an electric resistance (a-1) between an outer lead and an inner lead of an arbitrary wire (A-1) among a large number of the wires of the printed wiring board (A), and an electric resistance (a-2) between an outer lead and an inner lead of a wire (A-2) adjacent to the wire (A-1) is within a range of ±6% of the average electric resistance (A-ave.) of the wires of the printed wiring board (A), and
- a difference ($\Delta\Omega$–A) between a maximum electric resistance (a-max) and a minimum electric resistance (a-min) of the wires formed in the printed wiring board (A) is within a range of ±8% of the average electric resistance (A-ave.) of the wires of the printed wiring board (A).

17. The printed wiring board group described in claim 15, wherein an electronic part is mounted on each of the printed wiring boards structuring the printed wiring board group.

18. The printed wiring board group described in claim 15, wherein an electric current flowing in the respective printed wiring boards structuring the printed wiring board group is within a range of 0.1 mA to 2.0 A.

19. The printed wiring board group described in claim 15, wherein a difference of electric resistances between an outer lead and an inner lead of each wire formed in the respective printed wiring boards structuring the printed wiring board group is within a range of 30 m$\Omega$ to 300 m$\Omega$.

20. The printed wiring board group described in claim 15, wherein the printed wiring boards are at least three in number, have an identical wiring pattern, and are disposed in parallel.

* * * * *